(12) United States Patent
Hamano

(10) Patent No.: US 12,044,743 B2
(45) Date of Patent: Jul. 23, 2024

(54) ESTIMATION DEVICE, ESTIMATION METHOD, AND COMPUTER PROGRAM

(71) Applicant: GS Yuasa International Ltd., Kyoto (JP)

(72) Inventor: Yasuyuki Hamano, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 151 days.

(21) Appl. No.: 17/765,521

(22) PCT Filed: Oct. 2, 2020

(86) PCT No.: PCT/JP2020/037500
§ 371 (c)(1),
(2) Date: Mar. 31, 2022

(87) PCT Pub. No.: WO2021/066125
PCT Pub. Date: Apr. 8, 2021

(65) Prior Publication Data
US 2022/0326311 A1    Oct. 13, 2022

(30) Foreign Application Priority Data

Oct. 3, 2019 (JP) ................. 2019-183332

(51) Int. Cl.
*G01R 31/392* (2019.01)
*G01R 31/374* (2019.01)
(Continued)

(52) U.S. Cl.
CPC ......... *G01R 31/392* (2019.01); *G01R 31/374* (2019.01); *G01R 31/3842* (2019.01); *H01M 10/06* (2013.01); *H01M 10/48* (2013.01)

(58) Field of Classification Search
None
See application file for complete search history.

(56) References Cited

U.S. PATENT DOCUMENTS

2001/0012589 A1* 8/2001 Yoshihara ............... H01M 4/73
                                                      429/241
2004/0207367 A1* 10/2004 Taniguchi .......... G01R 31/3648
                                                      320/149
(Continued)

FOREIGN PATENT DOCUMENTS

EP       2386754 A1      11/2011
JP       60-101867 A     6/1985
(Continued)

OTHER PUBLICATIONS

International Search Report (ISR) dated Dec. 8, 2020 filed in PCT/JP2020/037500.

*Primary Examiner* — Jas A Sanghera
(74) *Attorney, Agent, or Firm* — RANKIN, HILL & CLARK LLP

(57) ABSTRACT

An estimation device includes: a deriving unit (31) that derives a derivation history based on a current and a voltage of a lead-acid battery and a temperature of the lead-acid battery; a specifying unit 31 that specifies at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of: a first relationship between a first history based on the current, the voltage, and the temperature of the lead-acid battery, and the first degree; a second relationship between a second history and the second degree; a third relationship between a third history and the third degree; and a fourth relationship between a fourth history and the fourth degree; and an (Continued)

estimating unit (31) that estimates a degree of deterioration of the lead-acid battery based on the specified at least two degrees.

11 Claims, 15 Drawing Sheets

(51) Int. Cl.
  *G01R 31/3842* (2019.01)
  *H01M 10/06* (2006.01)
  *H01M 10/48* (2006.01)

(56) References Cited

U.S. PATENT DOCUMENTS

| 2006/0158151 A1* | 7/2006 | Kimura | H01M 10/486 320/106 |
|---|---|---|---|
| 2009/0033277 A1* | 2/2009 | Ludtke | H02J 7/0048 320/125 |
| 2011/0288691 A1 | 11/2011 | Abe et al. | |
| 2019/0120909 A1* | 4/2019 | Koizumi | H02J 7/14 |
| 2020/0284842 A1 | 9/2020 | Endo et al. | |

FOREIGN PATENT DOCUMENTS

| JP | 2-109263 A | 4/1990 |
|---|---|---|
| JP | H11167931 A | 6/1999 |
| JP | 2004-333472 A | 11/2004 |
| JP | 2004317256 A | 11/2004 |
| JP | 2006172748 A | 6/2006 |
| JP | 2010159661 A | 7/2010 |
| JP | 2014-105995 A | 6/2014 |
| JP | 2016-109639 A | 6/2016 |
| JP | 2019066216 A | 4/2019 |
| JP | 2019-79629 A | 5/2019 |
| JP | 2019078572 A | 5/2019 |

* cited by examiner

Fig. 5

| No. | Lifetime effective discharge capacity | Lifetime effective charge capacity | Lifetime effective overcharge capacity | Temperature integrated value | SOC 0 to 20% stay time | SOC 20 to 40% stay time | SOC 40 to 60% stay time | SOC 60 to 80% stay time | SOC 80 to 100% stay time | Positive electrode grid thickness | Diagnosis information | First degree | Second degree | Third degree | Fourth degree | Deterioration degree |
|---|---|---|---|---|---|---|---|---|---|---|---|---|---|---|---|---|
| 1 | | | | | | | | | | | | 5 | 1 | 1 | 0 | 9 |
| 2 | | | | | | | | | | | | 2 | 5 | 0 | 2 | 8 |
| 3 | | | | | | | | | | | | 3 | 1 | 3 | 0 | 10 |
| ... | ... | ... | ... | ... | ... | ... | ... | ... | ... | ... | ... | ... | ... | ... | ... | ... |

| No. | Lifetime effective discharge capacity | Lifetime effective charge capacity | Lifetime effective overcharge capacity | Temperature integrated value | SOC 0 to 20% stay time | SOC 20 to 40% stay time | SOC 40 to 60% stay time |
|---|---|---|---|---|---|---|---|
| 1 | | | | | | | |
| 2 | | | | | | | |
| 3 | | | | | | | |
| ... | ... | ... | ... | ... | ... | ... | ... |
| 10 | | | | | | | |

| SOC 60 to 80% stay time | SOC 80 to 100% stay time | Positive electrode grid thickness | Diagnosis information | First degree | Second degree | Third degree | Fourth degree | Deterioration degree |
|---|---|---|---|---|---|---|---|---|
| | | | | 0 | 0 | 0 | 0 | 1 |
| | | | | 1 | 0 | 1 | 0 | 3 |
| | | | | 2 | 1 | 1 | 0 | 4 |
| ... | ... | ... | ... | ... | ... | ... | ... | ... |
| | | | | 3 | 1 | 3 | 0 | 10 |

ESTIMATION DEVICE, ESTIMATION METHOD, AND COMPUTER PROGRAM

TECHNICAL FIELD

The present invention relates to an estimation device, an estimation method, and a computer program for estimating deterioration of a lead-acid battery.

BACKGROUND ART

Lead-acid batteries are used in various applications in addition to in-vehicle applications and industrial applications. For example, a secondary battery (energy storage device) such as an in-vehicle lead-acid battery is mounted on a moving body of a vehicle such as an automobile, a motorcycle, a forklift, or a golf car, and is used as a power supply source to a starter motor at the time of starting an engine and a power supply source to various electrical components such as lights. For example, an industrial lead-acid battery is used as an emergency power supply or a power supply source to a UPS.

It is known that deterioration of lead-acid batteries progresses due to various factors. It is necessary to appropriately determine the degree of deterioration in order to prevent stop of supply of power due to unexpected loss of function of the lead-acid battery.

Patent Document 1 discloses a deterioration determination device that calculates an internal resistance based on a current and a voltage of a lead-acid battery and determines deterioration based on the internal resistance.

PRIOR ART DOCUMENT

Patent Document

Patent Document 1: JP-A-2016-109639

SUMMARY OF THE INVENTION

Problems to be Solved by the Invention

Main deterioration factors of the lead-acid battery are softening of a positive electrode material, corrosion of a positive electrode grid, negative electrode sulfation, and shrinkage of a negative electrode material. When there are a plurality of deterioration factors, it is required to estimate the degree of deterioration of the lead-acid battery satisfactorily by estimating the degree of deterioration of the corresponding deterioration factor.

An object of the present invention is to provide an estimation device, an estimation method, and a computer program capable of estimating the degree of deterioration of a lead-acid battery.

Means for Solving the Problems

An estimation device according to the present invention includes: a deriving unit that derives a derivation history based on a current and a voltage of a lead-acid battery and a temperature of the lead-acid battery; a specifying unit that specifies at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of: a first relationship between a first history based on the current, the voltage, and the temperature of the lead-acid battery, and the first degree; a second relationship between a second history based on the current, the voltage, and the temperature of the lead-acid battery, and the second degree; a third relationship between a third history based on the current, the voltage, and the temperature of the lead-acid battery and the third degree; and a fourth relationship between a fourth history based on the current, the voltage, and the temperature of the lead-acid battery and the fourth degree; and an estimating unit that estimates a degree of deterioration of the lead-acid battery based on the specified at least two degrees.

An estimation device according to the present invention includes: a deriving unit that derives a derivation history based on a current and a voltage of a lead-acid battery and a temperature of the lead-acid battery; a specifying unit that specifies, when the derivation history based on the current and the voltage of the lead-acid battery and the temperature of the lead-acid battery is input, at least one degree of a first degree of softening of a positive electrode material, a second degree of corrosion of a positive electrode grid, a third degree of negative electrode sulfation, and a fourth degree of shrinkage of a negative electrode material by inputting the derived derivation history to a learning model that outputs the at least one degree; and an estimating unit that estimates a degree of deterioration of the lead-acid battery based on the specified at least one degree.

An estimation method according to the present invention includes: deriving a derivation history based on a current and a voltage of a lead-acid battery and a temperature of the lead-acid battery; specifying at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of: a first relationship between a first history based on the current, the voltage, and the temperature of the lead-acid battery, and the first degree; a second relationship between a second history based on the current, the voltage, and the temperature of the lead-acid battery, and the second degree; a third relationship between a third history based on the current, the voltage, and the temperature of the lead-acid battery, and the third degree; and a fourth relationship between a fourth history based on the current, the voltage, and the temperature of the lead-acid battery, and the fourth degree; and estimating a degree of deterioration of the lead-acid battery based on the specified at least two degrees.

A computer program according to the present invention causes a computer to execute processing of: deriving a derivation history based on a current and a voltage of a lead-acid battery and a temperature of the lead-acid battery; specifying at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of: a first relationship between a first history based on the current, the voltage, and the temperature of the lead-acid battery, and the first degree; a second relationship between a second history based on the current, the voltage, and the temperature of the lead-acid battery, and the second degree; a third relationship between a third history based on the current, the voltage, and the temperature of the lead-acid battery, and the third degree; and a fourth relationship between a fourth history based on the current, the voltage, and the temperature of the lead-acid battery, and the fourth degree; and estimating a degree of deterioration of the lead-acid battery based on the specified at least two degrees.

BRIEF DESCRIPTION OF THE DRAWINGS

FIG. 5 is an explanatory diagram showing an example of a record layout of a deterioration degree DB.

FIG. 6 is an explanatory diagram showing an example of a record layout of a use history DB.

MODE FOR CARRYING OUT THE INVENTION

Outline of Embodiment

Figure 1:
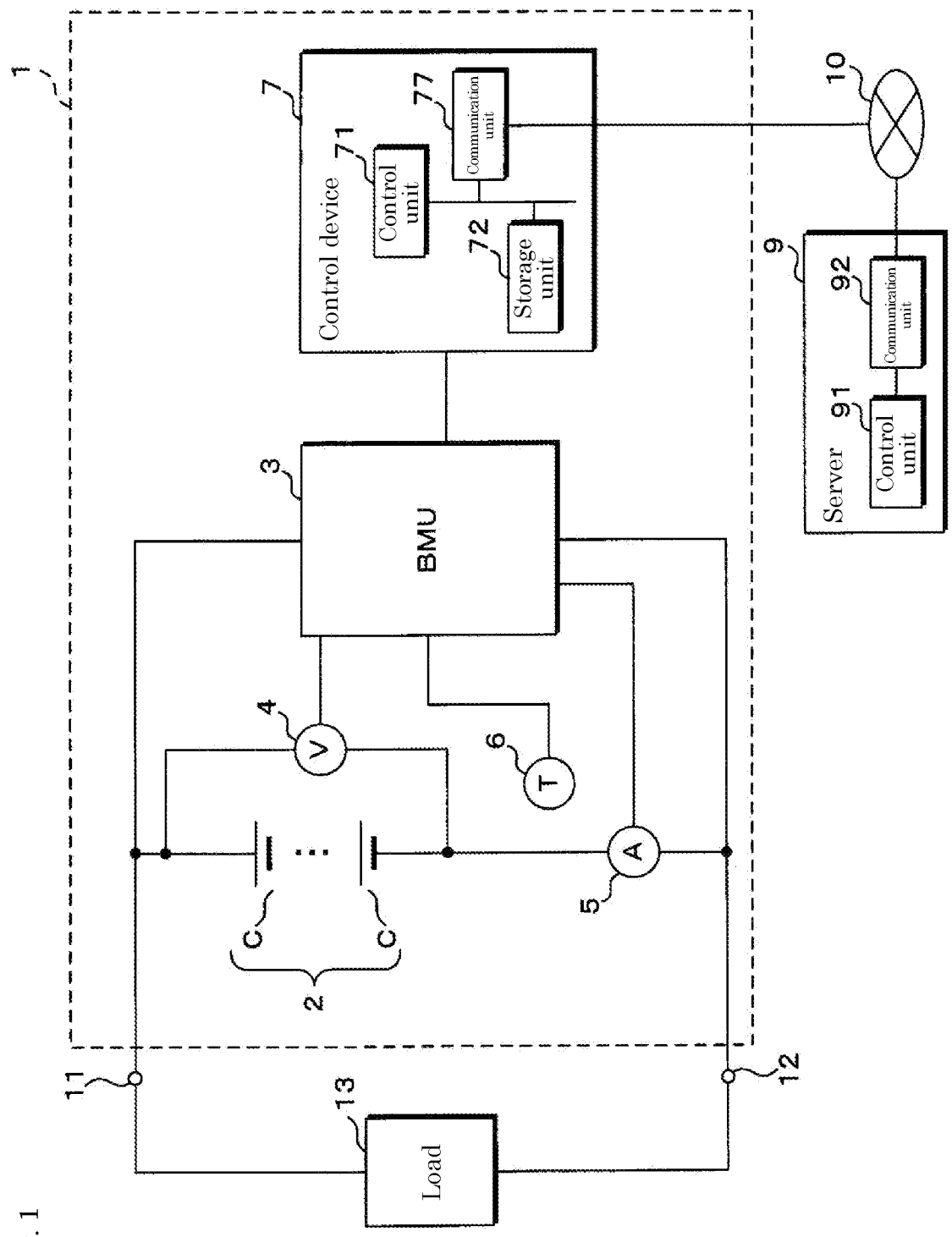
FIG. 1 is a block diagram showing configurations of a charge-discharge system, a load, and a server according to a first embodiment.

An estimation device according to an embodiment includes: a deriving unit that derives a derivation history based on a current and a voltage of a lead-acid battery and a temperature of the lead-acid battery; a specifying unit that specifies at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of: a first relationship between a first history based on the current, the voltage, and the temperature of the lead-acid battery, and the first degree; a second relationship between a second history based on the current, the voltage, and the temperature of the lead-acid battery, and the second degree; a third relationship between a third history based on the current, the voltage, and the temperature of the lead-acid battery and the third degree; and a fourth relationship between a fourth history based on the current, the voltage, and the temperature of the lead-acid battery and the fourth degree; and an estimating unit that estimates a degree of deterioration of the lead-acid battery based on the specified at least two degrees.

Here, the first history, the first history, the second history, the third history, and the fourth history may be the same or different. A part thereof may be common. For example, the first history includes histories of a lifetime effective discharge capacity, a temperature accumulation value, a use period, and the like. The second history includes histories of a lifetime effective overcharge capacity, a temperature integrated value, a use period, and the like. The third history includes histories of a lifetime effective charge capacity, a temperature integrated value, a use period, a standing time, a stay time in each SOC section, and the like. The fourth history includes histories of a lifetime effective charge capacity, a temperature integrated value, a use period, and the like.

Deterioration factors of the lead-acid battery include softening of the positive electrode material, corrosion of the positive electrode grid, negative electrode sulfation, shrinkage of the negative electrode material, and the like. There is a case where the degree of deterioration cannot be appropriately estimated only by individually estimating these deterioration factors.

For example, in a case where it is estimated that any one of the above-described deterioration factors is extremely progressing, it is conceivable to encourage replacement of the lead-acid battery based on the measurement result of the factor affecting the deterioration factor.

However, the inventor of the present application has found that, even when the degree of each deterioration factor is not so large in reality, it should be determined that the deterioration of the lead-acid battery as a whole has progressed depending on a combination of these deterioration factors.

Conventionally, the mutual relationship and influence of these deterioration factors have not been sufficiently studied.

According to the above configuration, a history based on current, voltage, and temperature is derived, two or more degrees of deterioration factors are specified based on a relationship among the history and corrosion of the positive electrode grid, softening of the positive electrode material, negative electrode sulfation, and shrinkage of the negative electrode material, which are obtained in advance, and the degree of deterioration of the lead-acid battery is estimated based on the degrees of deterioration factors.

The deterioration of the lead-acid battery can be satisfactorily estimated by a combination of two or more degrees of deterioration factors. For example, rapid deterioration of the lead-acid battery due to simultaneous progress of deterioration of the positive electrode plate and the negative electrode plate can be satisfactorily predicted. In addition, deterioration of the lead-acid battery can be satisfactorily predicted even when a use history adversely affecting only different deterioration factors occurs after a use history adversely affecting only one deterioration factor, or when the above two types of use history patterns are repeated.

By predicting deterioration, it is possible to estimate a failure risk and avoid a sudden unusable state.

In the estimation device described above, when the derivation history based on the current and the voltage of the lead-acid battery and the temperature of the lead-acid battery is input, the specifying unit may specify at least two degrees of the first degree, the second degree, the third degree, and the fourth degree by inputting the derived derivation history to a first learning model that outputs the at least two degrees, and, when at least two degrees of the first degree, the second degree, the third degree, and the fourth degree are input, the estimating unit may input the specified at least two degrees to a second learning model that outputs the degree of deterioration of the lead-acid battery to estimate the degree of deterioration. The information input to the first learning model may be input to the second learning model of the estimating unit.

According to the above configuration, the two or more degrees of deterioration factors can be easily and satisfactorily specified using the first learning model, and the deterioration of the lead-acid battery can be easily and satisfactorily estimated using the second learning model.

In the estimation device described above, the derivation history may include an effective discharge capacity obtained by correcting a discharge capacity with a coefficient based on a temperature, an effective charge capacity obtained by correcting a charge capacity with a coefficient based on a temperature, or a temperature integrated value obtained by multiplying a temperature by a predetermined coefficient and integrating the temperature.

The correction coefficient may include not only a temperature but also a discharge capacity, a current value, and an electric capacity.

According to the above configuration, the degree of the deterioration factor can be satisfactorily specified.

In the estimation device described above, the specifying unit may specify the at least two degrees based on a derivation history and design information of the lead-acid battery.

According to the above configuration, the degree of the deterioration factor can be satisfactorily specified based on the degree of the deterioration factor and the design information.

In the estimation device described above, the design information may be at least one selected from the group consisting of a number of plates, an amount of a positive active material, a mass of a positive electrode grid, a thickness of the positive electrode grid, a design of the positive electrode grid, a density of a positive electrode material, a composition of the positive electrode material, an amount and a type of an additive in the positive electrode material, a composition of a positive electrode alloy, a presence or absence, a thickness, a material and an air permeability of nonwoven fabric abutting on a positive electrode plate, an amount of a negative active material, an amount and a type of carbon in the negative active material, an amount and a type of an additive in a negative electrode material, a specific surface area of the negative electrode material, a type and a concentration of an additive of an electrolyte solution, and a specific gravity and an amount of the electrolyte solution.

According to the above configuration, the degree of the deterioration factor can be satisfactorily specified.

In the estimation device described above, the estimating unit may estimate the degree of deterioration based on the at least two degrees and the diagnosis information of the lead-acid battery. For example, when a difference is confirmed by comparing the specified deterioration degree with the diagnosis information, the cause may be corrected as a variation from the battery design or a data loss of the history information.

According to the above configuration, the deterioration degree can be satisfactorily estimated based on the degree of the deterioration factor and the diagnosis information.

In the estimation device described above, the diagnosis information may be at least one selected from the group consisting of an internal resistance, an open circuit voltage, and a state of charge (SOC).

According to the above configuration, the degree of the deterioration factor can be satisfactorily specified.

The estimation device described above may further include: a storage unit that stores the derivation history and the degree of deterioration or the diagnosis information specified by the specifying unit; and a history erasing unit that erases the derivation history and the degree of deterioration or the diagnosis information when it is estimated that the lead-acid battery has been replaced based on the degree of deterioration or the diagnosis information and a threshold.

When it is determined that the lead-acid battery has been replaced based on the degree of deterioration or the diagnosis information, for example, data of a use history DB to be described later can be erased.

An estimation device according to an embodiment includes: a deriving unit that derives a derivation history based on a current and a voltage of a lead-acid battery and a temperature of the lead-acid battery; a specifying unit that specifies, when the derivation history based on the current and the voltage of the lead-acid battery and the temperature of the lead-acid battery is input, at least one degree of a first degree of softening of a positive electrode material, a second degree of corrosion of a positive electrode grid, a third degree of negative electrode sulfation, and a fourth degree of shrinkage of a negative electrode material by inputting the derived derivation history to a learning model that outputs the at least one degree; and an estimating unit that estimates a degree of deterioration of the lead-acid battery based on the specified at least one degree.

According to the above configuration, the degree of the deterioration factor can be easily and satisfactorily specified using the learning model, and the deterioration of the lead-acid battery can be satisfactorily estimated based on the specified degree of the deterioration factor.

An estimation method according to an embodiment includes: deriving a derivation history based on a current and a voltage of a lead-acid battery and a temperature of the lead-acid battery; specifying at least two degrees of a first degree of softening of a positive active material, a second degree of corrosion of a positive electrode grid, a third degree of negative electrode sulfation, and a fourth degree of shrinkage of a negative electrode material based on the derived derivation history and at least two relationships selected from the group consisting of: a first relationship between a first history based on the current, the voltage, and the temperature of the lead-acid battery, and the first degree; a second relationship between a second history based on the current, the voltage, and the temperature of the lead-acid battery, and the second degree; a third relationship between a third history based on the current, the voltage, and the temperature of the lead-acid battery, and the third degree; and a fourth relationship between a fourth history based on the current, the voltage, and the temperature of the lead-acid battery, and the fourth degree; and estimating a degree of deterioration of the lead-acid battery based on the specified at least two degrees.

According to the above configuration, a history based on current, voltage, and temperature is derived, two or more degrees of deterioration factors are specified based on a relationship among the history and corrosion of the positive electrode grid, softening of the positive electrode material, negative electrode sulfation, and shrinkage of the negative electrode material, which are obtained in advance, and the degree of deterioration of the lead-acid battery is estimated based on the degrees of deterioration factors.

A computer program according to an embodiment causes a computer to execute processing of: deriving a derivation history based on a current and a voltage of a lead-acid battery and a temperature of the lead-acid battery; specifying at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of: a first relationship between a first history based on the current, the voltage, and the temperature of the lead-acid battery, and the first degree; a second relationship between a second history based on the current, the voltage, and the temperature of the lead-acid battery, and the second degree; a third relationship between a third history based on the current, the voltage, and the temperature of the lead-acid battery, and the third degree; and a fourth relationship between a fourth history based on the current, the voltage, and the temperature of the lead-acid battery, and the fourth degree; and estimating a degree of deterioration of the lead-acid battery based on the specified at least two degrees.

First Embodiment

Figure 2:
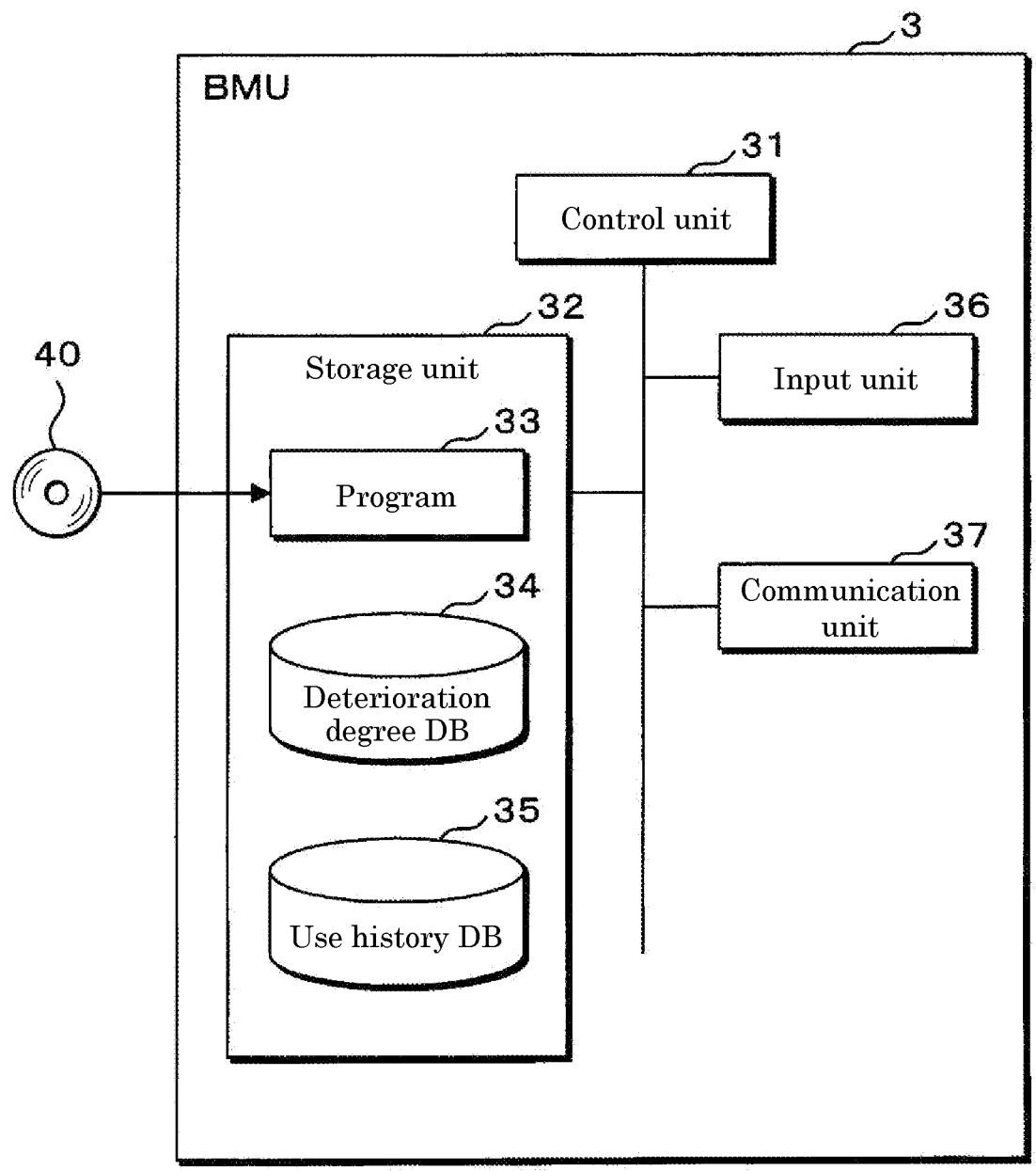
FIG. 2 is a block diagram showing a configuration of a BMU.

FIG. 1 is a block diagram showing configurations of a charge-discharge system 1, a load 13, and a server 9 according to a first embodiment, and FIG. 2 is a block diagram showing a configuration of a BMU 3.

The charge-discharge system 1 includes a lead-acid battery (hereinafter, referred to as a battery) 2, a battery management unit (BMU) 3, a voltage sensor 4, a current sensor 5, a temperature sensor 6, and a control device 7.

The BMU 3 includes a control unit 31, a storage unit 32, an input unit 36, and a communication unit 37. The BMU 3 may be a battery ECU.

The control device 7 controls the entire charge-discharge system 1, and includes a control unit 71, a storage unit 72, and a communication unit 77.

The server 9 includes a control unit 91 and a communication unit 92.

The control unit 71 of the control device 7 is connected to the control unit 91 via the communication unit 77, a network 10, and the communication unit 92.

The battery 2 is connected to the load 13 via terminals 11 and 12.

The control units 31, 71, and 91 include, for example, a central processing unit (CPU), a read only memory (ROM), a random access memory (RAM), and the like, and control the operations of the BMU 3, the control device 7, and the server 9.

The storage unit 32 and the storage unit 72 are configured by, for example, a hard disk drive (HDD) and the like, and store various programs and data.

The communication units 37, 77, and 92 have a function of communicating with other devices via a network, and can transmit and receive necessary information.

The storage unit 32 of the BMU 3 stores a deterioration estimation program 33. The program 33 is provided in a state of being stored in a computer-readable recording medium 40 such as a CD-ROM, a DVD-ROM, or a USB memory, for example, and is stored in the storage unit 32 by being installed in the BMU 3. In addition, the program 33 may be acquired from an external computer (not shown) connected to a communication network and stored in the storage unit 32.

The storage unit 32 also stores a deterioration degree DB 34 that stores a history, a degree of each deterioration factor, and a deterioration degree of the battery 2, and a use history DB 35 that stores a derivation history, a degree of each deterioration factor, and a deterioration degree for each battery 2. Details of the deterioration degree DB 34 and the use history DB 35 will be described later.

The input unit 36 receives inputs of detection results from the voltage sensor 4, the current sensor 5, and the temperature sensor 6.

In the embodiment, the BMU 3 functions as an estimation device of the present invention. Either the control device 7 or the server 9 may function as the estimation device. Even when the BMU 3 functions as the estimation device, the program 33, the deterioration degree DB 34, and the use history DB 35 are not necessarily all included in the storage unit 32, and any one of the program 33, the deterioration degree DB 34, and the use history DB 35 or all of them may be included in the control device 7 or included in the server 9 according to the embodiment. When the server 9 does not function as the estimation device, the charge-discharge system 1 may not be connected to the server 9.

The voltage sensor 4 is connected in parallel to the battery 2 and outputs a detection result corresponding to the entire voltage of the battery 2.

The current sensor 5 is connected in series to the battery 2, and outputs a detection result according to the current of the battery 2. As the current sensor 5, for example, a current sensor that is not electrically connected to the battery 2, such as a clamp current sensor, can be used.

The temperature sensor 6 is disposed near the battery 2, and outputs a detection result corresponding to a temperature of the battery 2. For prediction of deterioration, it is preferable to use a temperature of an electrolyte solution of the battery 2 as the temperature of the battery 2. Therefore, the temperature detected by the temperature sensor 6 may be corrected to be the temperature of the electrolyte solution according to the position where the temperature sensor 6 is disposed.

Figure 3:
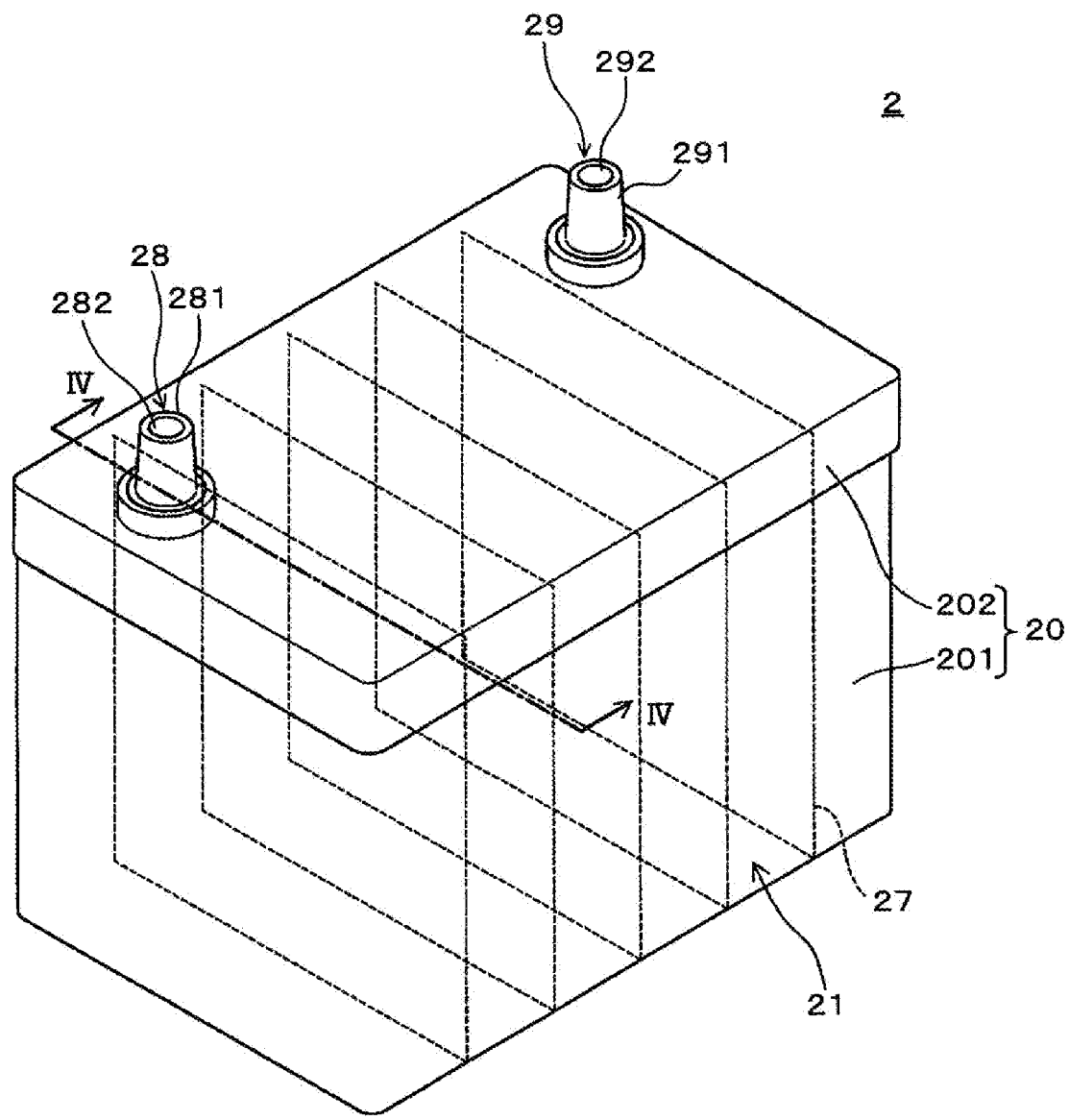
FIG. 3 is a perspective view showing an external configuration of a battery.
Figure 4:
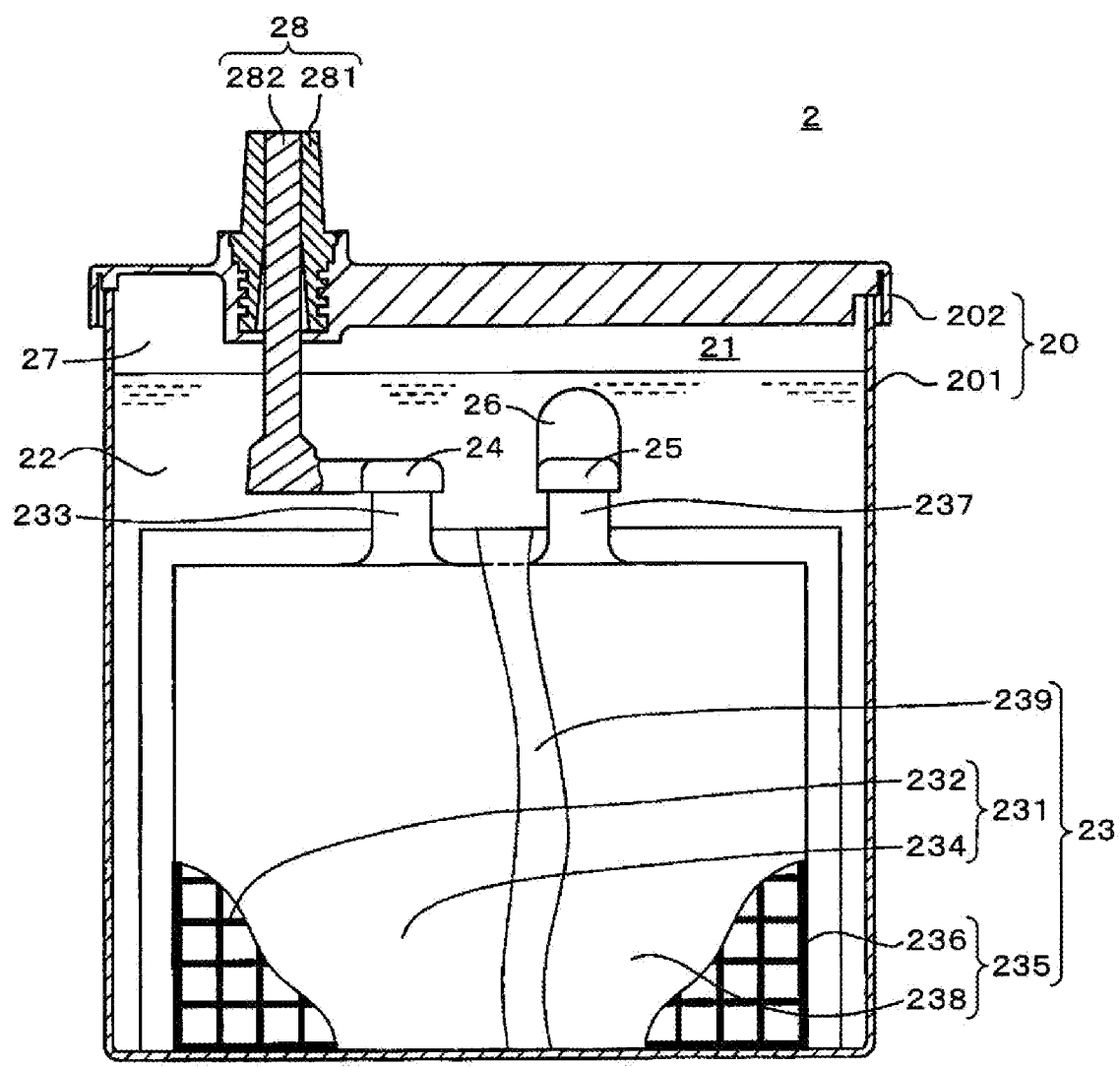
FIG. 4 is a cross-sectional view taken along the line IV-IV of FIG. 3.

FIG. 3 is a perspective view showing an external configuration of the battery 2 which is a liquid type battery for an automobile as an example, and FIG. 4 is a cross-sectional view taken along the line Iv-Iv of FIG. 3.

As shown in FIGS. 3 and 4, the battery 2 includes a container 20, a positive electrode terminal 28, a negative electrode terminal 29, and a plurality of elements 23.

The container 20 includes a container main body 201 and a lid 202. The container main body 201 is a rectangular parallelepiped case whose upper portion is opened, and is formed of, for example, a synthetic resin or the like. For example, the lid 202 made of a synthetic resin closes an opening portion of the container main body 201. The peripheral edge portion of the lower surface of the lid 202 and the peripheral edge portion of the opening portion of the container main body 201 are joined by, for example, thermal welding. The space in the container 20 is partitioned by partition walls 27 into a plurality of cell chambers 21 arranged in the longitudinal direction of the container 20.

One element 23 is accommodated in each cell chamber 21 in the container 20. An electrolyte solution 22 containing dilute sulfuric acid is accommodated in each cell chamber 21 in the container 20, and the entire element 23 is immersed in the electrolyte solution 22. The electrolyte solution 22 is injected into the cell chamber 21 from an electrolyte solution filling port (not shown) provided in the lid 202.

The element 23 includes a plurality of positive electrode plates 231, a plurality of negative electrode plates 235, and a separator 239. The plurality of positive electrode plates 231 and the plurality of negative electrode plates 235 are alternately arranged.

The positive electrode plate 231 includes a positive electrode grid 232 and a positive electrode material 234 supported by the positive electrode grid 232. The positive electrode grid 232 is a conductive member having a bone portion arranged in a substantially grid shape or a net-like shape, and is formed of, for example, lead or a lead alloy. The positive electrode grid 232 has an ear 233 protruding upward near the upper end. The positive electrode material 234 contains a negative active material (lead dioxide or lead sulfate) that develops capacity by oxidation-reductive reaction. The positive electrode material 234 may further contain a known additive.

The negative electrode plate 235 includes a negative electrode grid 236 and a negative electrode material 238 supported by the negative electrode grid 236. The negative electrode grid 236 is a conductive member having a bone portion arranged in a substantially grid shape or a net-like shape, and is formed of, for example, lead or a lead alloy. The negative electrode grid 236 has an ear 237 protruding upward near the upper end. The negative electrode material 238 contains a negative active material (lead or lead sulfate) that develops capacity by oxidation-reductive reaction. The negative electrode material 238 may further contain a known additive.

The separator 239 is formed of, for example, an insulating material such as glass or synthetic resin. The separator 239 is interposed between the positive electrode plate 231 and the negative electrode plate 235 adjacent to each other. The separator 239 may be configured as an integral member or may be separately provided between the positive electrode plate 231 and the negative electrode plate 235. The separator 239 may be disposed so as to package either the positive electrode plate 231 or the negative electrode plate 235.

The ears 233 of the plurality of positive electrode plates 231 are connected to a strap 24 formed of, for example, lead or a lead alloy. The plurality of positive electrode plates 231 are electrically connected via the strap 24. Similarly, the ears 237 of the plurality of negative electrode plates 235 are connected to a strap 25 formed of, for example, lead or a lead alloy. The plurality of negative electrode plates 235 are electrically connected via the strap 25.

In the battery 2, the strap 25 in one cell chamber 21 is connected to the strap 24 in the cell chamber 21 on one side adjacent to the one cell chamber 21 via an intermediate pole 26 formed of, for example, lead or a lead alloy. The strap 24 in the one cell chamber 21 is connected to the strap 25 in the cell chamber 21 on the other side adjacent to the one cell chamber 21 via the intermediate pole 26. That is, the plurality of elements 23 of the battery 2 are electrically connected in series via the straps 24 and 25 and the intermediate pole 26. As shown in FIG. 4, the strap 24 accommodated in the cell chamber 21 located at one end in the direction in which cells C are arranged is connected not to the intermediate pole 26 but to a positive electrode pole 282 to be described later. The strap 25 accommodated in the cell chamber 21 located at the other end in the direction in which the cells C are arranged is connected not to the intermediate pole 26 but to a negative electrode pole 292 (not shown).

The positive electrode terminal 28 is disposed at one end portion in the direction in which the cells C are arranged, and the negative electrode terminal 29 is disposed near the other end portion in the direction.

As shown in FIG. 4, the positive electrode terminal 28 includes a bushing 281 and the positive electrode pole 282. The bushing 281 is a substantially cylindrical conductive member, and is formed of, for example, a lead alloy. A lower portion of the bushing 281 is integrated with the lid 202 by insert molding, and an upper portion of the bushing 281 protrudes upward from an upper surface of the lid 202. The positive electrode pole 282 is a substantially cylindrical conductive member, and is formed of, for example, a lead alloy. The positive electrode pole 282 is inserted into a hole of the bushing 281. The upper end portion of the positive electrode pole 282 is located at substantially the same position as the upper end portion of the bushing 281, and is joined to the bushing 281 by welding, for example. The lower end portion of the positive electrode pole 282 protrudes downward from the lower end portion of the bushing 281 and further protrudes downward from the lower surface of the lid 202, and is connected to the strap 24 accommodated in the cell chamber 21 located at one end portion in the direction in which the cells C are arranged.

Similarly to the positive electrode terminal 28, the negative electrode terminal 29 includes a bushing 291 and the negative electrode pole 292 (see FIG. 3), and has the same configuration as the positive electrode terminal 28.

When the battery 2 is discharged, a load (not shown) is connected to the bushing 281 of the positive electrode terminal 28 and the bushing 291 of the negative electrode terminal 29, and electric power generated by a reaction (a reaction in which lead sulfate is generated from lead dioxide) in the positive electrode plate 231 and a reaction (a reaction in which lead sulfate is generated from lead (spongy lead)) in the negative electrode plate 235 of each of the elements 23 is supplied to the load. When the battery 2 is charged, a power source (not shown) is connected to the bushing 281 of the positive electrode terminal 28 and the bushing 291 of the negative electrode terminal 29, and a reaction (a reaction in which lead dioxide is generated from lead sulfate) in the positive electrode plate 231 and a reaction (a reaction in which lead (spongy lead) is generated from lead sulfate) in the negative electrode plate 235 of each of the elements 23 occur by power supplied from the power source, and the battery 2 is charged.

FIG. 5 is an explanatory diagram showing an example of a record layout of the deterioration degree DB 34 described above.

The deterioration degree DB 34 stores a No. column, a lifetime effective discharge capacity column, a lifetime effective charge capacity column, a lifetime effective overcharge capacity column, a temperature integrated value column, history columns such as an SOC 0 to 20% stay time column, an SOC 20 to 40% stay time column, an SOC 40 to 60% stay time column, an SOC 60 to 80% stay time column, and an SOC 80 to 100% stay time column, a design information column such as a positive electrode grid thickness column, a diagnosis information column, deterioration factor degree columns such as a first degree column, a second degree column, a third degree column, and a fourth degree column, and a deterioration degree column in association with each other.

The No. column stores the No. of the deterioration degree of the plurality of different batteries 2 and the No. of the deterioration degree of the same battery 2 at different timings. In the lifetime effective discharge capacity column, for example, the discharge capacity of the battery 2 is measured every minute, and an integrated value of the effective discharge capacity obtained by multiplying the discharge capacity by a coefficient based on the temperature of the battery 2 at that time is stored. In the lifetime effective charge capacity column, for example, the charge capacity of the battery 2 is measured every minute, and an integrated value of the effective charge capacity obtained by multiplying the charge capacity by a coefficient based on the temperature of the battery 2 at that time is stored. The lifetime effective overcharge capacity column stores an integrated value of the effective overcharge capacity obtained by subtracting the effective discharge capacity from the effective charge capacity.

The temperature integrated value column stores, for example, an integrated value obtained by multiplying the center temperature of each temperature interval by a predetermined coefficient and time every 10° C. from −20° C. to 80° C.

In the SOC 0 to 20% stay time column, for example, the average SOC is obtained in units of one hour, and the integrated value of the time during which the average SOC is within the range of 0 to 20% is stored. Similarly, the SOC 20 to 40% stay time column, the SOC 40 to 60% stay time column, the SOC 60 to 80% stay time column, and the SOC 80 to 100% stay time column store integrated values of times during which the average SOC is within the range of 20 to 40%, within the range of 40 to 60%, within the range of 60 to 80%, and within the range of 80 to 100%.

The positive electrode grid thickness column stores the thickness of the positive electrode grid.

The diagnosis information column stores diagnosis information such as internal resistance, SOC, and OCV.

The first degree column stores a first degree which is a degree of softening of the positive electrode material. The first degree is represented by evaluation of six grades of numerical values from 0 to 5. The evaluation is performed based on a falling amount of the positive electrode material due to softening, a degree of softening of the positive electrode material, or the like. 0 is good and the degree gets worse as the number gets larger.

The second degree column stores a second degree which is a degree of corrosion of the positive electrode grid. The second degree is represented by a six-grade evaluation. The evaluation is represented by the same numerical value as described above. The evaluation is performed by the mass of the positive electrode grid reduced by corrosion, the mass of the remaining positive electrode grid, or the like.

The third degree column stores a third degree which is a degree of negative electrode sulfation. The third degree is represented by a six-grade evaluation. The evaluation is represented by the same numerical value as described above. The evaluation is performed by the amount of lead sulfate in the negative electrode material or the like.

The fourth degree column stores a fourth degree which is a degree of shrinkage of the negative electrode material. The fourth degree is represented by a six-grade evaluation. The evaluation is represented by the same numerical value as described above. The evaluation is performed based on the degree of cracking due to shrinkage of the electrode material, the degree of reduction in specific surface area, or the like.

The evaluation of the first degree, the second degree, the third degree, and the fourth degree is not limited to six grades, and may be 100 grades, or a value of a physical quantity associated with each degree may be used.

The deterioration degree column stores the deterioration degree represented by a ten-grade evaluation. The numerical value of 1 to 10 of the deterioration degree is determined based on the range of State of Health (SOM. When the following ratio is defined as SOH, "1" is in the range of 90 to 100%, and "10" is in the range of 0 to 10%. The SOH can be determined based on expected characteristics of the lead-acid battery. For example, using the usable period as a reference, the ratio of the usable period remaining at the time of evaluation may be determined as the SOH. In addition, the voltage at the time of the normal temperature high rate discharge at the time of the evaluation may be used for the evaluation of the SOH based on the voltage at the time of the normal temperature high rate discharge. In any case, when the SOH is 0, it indicates a state in which the function of the lead-acid battery is lost.

In the case of No. 3 in FIG. 5, the evaluation values of the first degree and the third degree are 3, respectively, and it can be seen that the deterioration degree increases depending on the combination of the first degree and the third degree. This is considered to be because, although the deterioration degree in each of the positive and negative electrode plates is moderate, a region where a resistance component is increased due to deterioration is widened on a path through which a current flows during discharge or charge, and thus the internal resistance of the entire battery is increased.

The information stored in the deterioration degree DB 34 is not limited to the above case.

As the history information, for example, the standing time or the like may be stored in addition to the lifetime effective discharge capacity, the lifetime effective charge capacity, the lifetime effective overcharge capacity, and the temperature integrated value.

As the design information, in addition to the positive electrode grid thickness, at least one selected from the group consisting of the number of the positive electrode plates and the negative electrode plates, the number of the plates, the amount of the positive active material, the mass of the positive electrode grid, the design of the positive electrode grid, the density of the positive electrode material, the composition of the positive electrode material, the amount and the type of the additive in the positive electrode material, the composition of the positive electrode alloy, the presence or absence, the thickness, the material and the air permeability of the nonwoven fabric abutting on the positive electrode plate, the amount of the negative active material, the amount and the type of carbon in the negative active material, the amount and the type of the additive in the negative electrode material, the specific surface area of the negative electrode material, the type and the concentration of the additive of the electrolyte solution, and the specific gravity and the amount of the electrolyte solution may be stored.

An internal resistance, an open circuit voltage, or the like may be stored as the diagnosis information. Since the internal resistance and the open circuit voltage depend on the SOC, the internal resistance and the open circuit voltage may be corrected by a separately acquired SOC.

FIG. 6 is an explanatory diagram showing an example of a record layout of the use history DB 35 described above.

The use history DB 35 stores a derivation history at each estimation time point, a degree of a deterioration factor, and a deterioration degree for each battery 2. FIG. 6 shows a use history of the battery 2 of ID No. 1. The use history DB 35 stores a No. column, a lifetime effective discharge capacity column, a lifetime effective charge capacity column, a lifetime effective overcharge capacity column, a temperature integrated value column, an SOC 0 to 20% stay time column, an SOC 20 to 40% stay time column, an SOC 40 to 60% stay time column, an SOC 60 to 80% stay time column, an SOC 80 to 100% stay time column, a positive electrode grid thickness column, a diagnosis information column, a first degree column, a second degree column, a third degree column, a fourth degree column, and a deterioration degree column. The No. column stores the No. at each estimation time point. The lifetime effective discharge capacity column, the lifetime effective charge capacity column, the lifetime effective overcharge capacity column, the temperature integrated value column, the SOC 0 to 20% stay time column, the SOC 20 to 40% stay time column, the SOC 40 to 60% stay time column, the SOC 60 to 80% stay time column, the SOC 80 to 100% stay time column, the positive electrode grid thickness column, and the diagnosis information column store the same contents as the lifetime effective discharge capacity column, the lifetime effective charge capacity column, the lifetime effective overcharge capacity column, the temperature integrated value column, the SOC 0 to 20% stay time column, the SOC 20 to 40% stay time column, the SOC 40 to 60% stay time column, the SOC 60 to 80% stay time column, the SOC 80 to 100% stay time column, the positive electrode grid thickness column, and the diagnosis information column in the deterioration degree DB 34.

As will be described later, the first degree column, the second degree column, the third degree column, and the fourth degree column store the first degree, the second degree, the third degree, and the fourth degree specified based on the use history at each estimation time point.

The deterioration degree column stores the deterioration degree estimated based on the specified first degree, second degree, third degree, and fourth degree.

The information stored in the use history DB 35 is not limited to the above case.

Hereinafter, a method for estimating the deterioration degree will be described.

Figure 7:
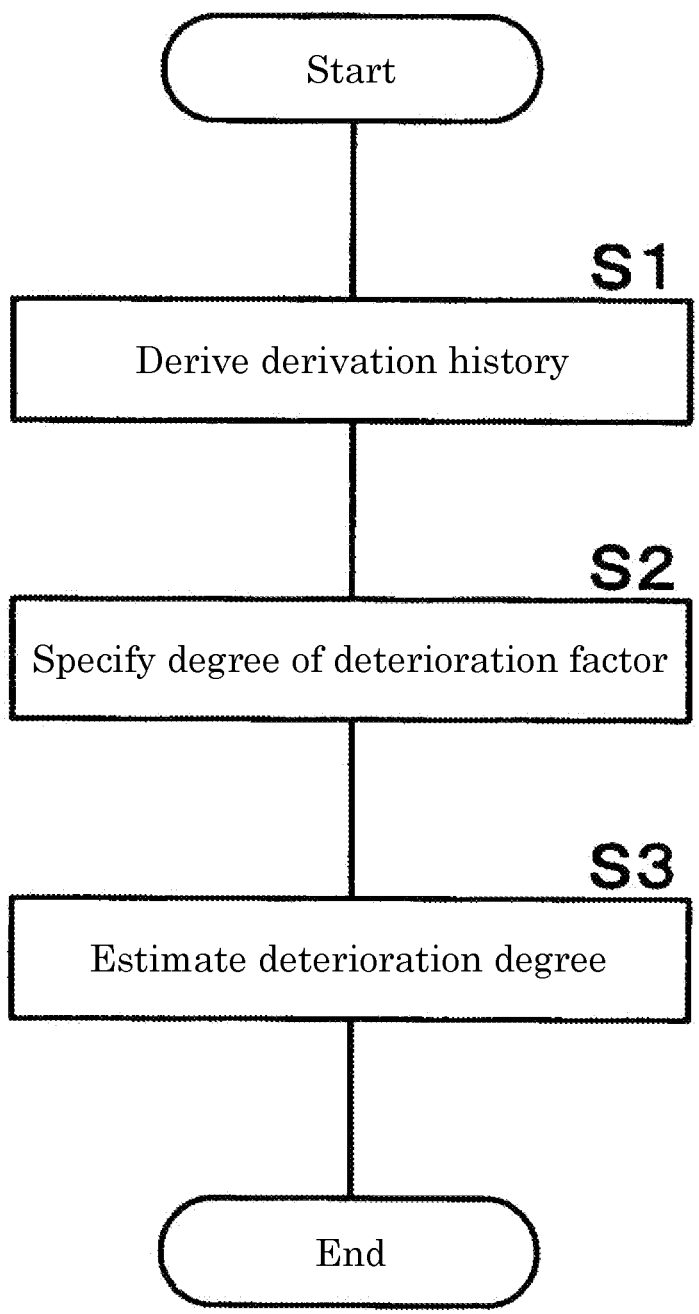
FIG. 7 is a flowchart showing a procedure of deterioration degree estimation processing by a control unit.

FIG. 7 is a flowchart showing a procedure of deterioration degree estimation processing by the control unit 31. The control unit 31 performs the following processing at a predetermined estimation time point.

For the battery 2 of ID No. 1, the control unit 31 derives a derivation history such as the lifetime effective discharge capacity based on the voltage, the current, and the temperature acquired at the time of estimation, and stores the derivation histories in the use history DB 35 (S1).

The control unit 31 reads the deterioration degree DB 34, specifies the first degree based on a first relationship between the first history and the first degree derived from the data in the deterioration degree DB 34, and stores the first degree in the use history DB 35 (S2). Similarly, the control unit 31 specifies the second degree based on a second relationship between the second history and the second degree, specifies the third degree based on a third relationship between the third history and the third degree, specifies the fourth degree based on a fourth relationship between the fourth history and the fourth degree, which are derived from the data in the deterioration degree DB 34, and stores the second degree, the third degree, and the fourth degree in the use history DB 35.

Based on the relationship between the first degree, the second degree, the third degree, and the fourth degree, which are derived from the data in the deterioration degree DB 34, and the deterioration degree, the control unit 31 estimates the deterioration degree from the specified degree of the deterioration factor, stores the deterioration degree in the use history DB 35 (S3), and ends the processing.

When the design information or the diagnosis information is also stored in the deterioration degree DB 34, the first degree is specified based on the first relationship among the first history, the design information or the diagnosis information, and the first degree in S2. The second degree, the third degree, and the fourth degree are also specified based on the relationship among the history, the design information or the diagnosis information, and the degree.

In the present embodiment, a case where all of the first degree, the second degree, the third degree, and the fourth degree are specified and the deterioration degree is estimated using these degrees has been described, but the present invention is not limited thereto. At least two of the first degree, the second degree, the third degree, and the fourth degree may be specified, and the deterioration degree may be estimated using these.

The deterioration degree DB 34 may store functions of the first relationship, the second relationship, the third relationship, and the fourth relationship.

When determining that the battery 2 has been replaced based on the estimated deterioration degree or diagnosis information and a preset threshold, the control unit 31 may delete and reset the data in the use history DB 35. When determining that the battery 2 has been replaced, the control unit 31 may perform an operation other than resetting the data in the use history DB. That is, when determining that the battery 2 has been replaced, the control unit 31 may set the starting time point of integration of the history information stored in the use history DB as the time point at which it is determined that the battery 2 has been replaced.

According to the present embodiment, a derivation history based on current, voltage, and temperature is derived, two or more degrees of deterioration factors are specified based on a relationship among the history and corrosion of the positive electrode grid, softening of the positive electrode material, negative electrode sulfation, and shrinkage of the negative electrode material, which are obtained in advance, and the degree of deterioration of the battery 2 is satisfactorily estimated based on the degrees of deterioration factors.

Second Embodiment

Figure 8:
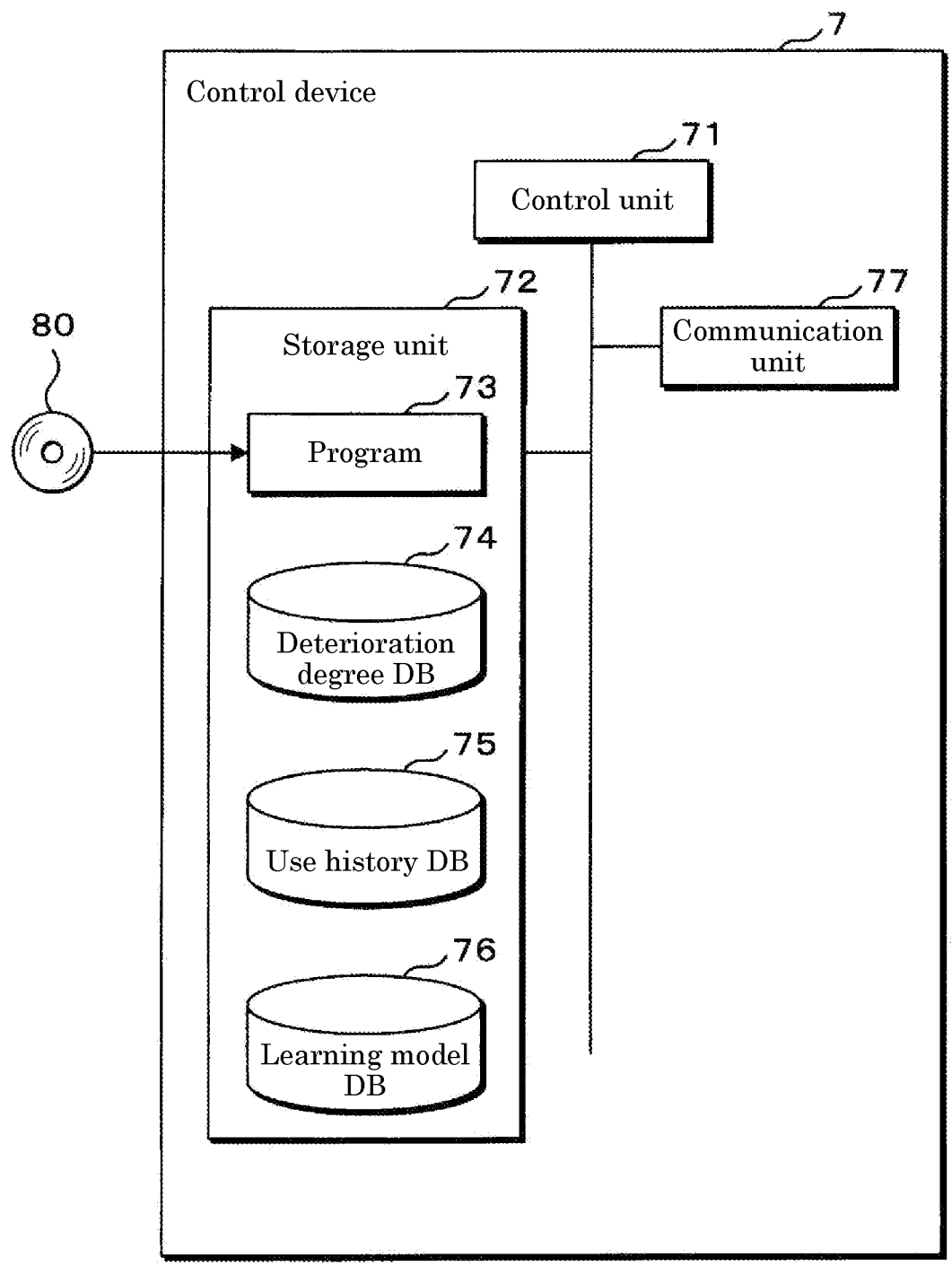
FIG. 8 is a block diagram showing a configuration of a control device according to a second embodiment.

FIG. 8 is a block diagram showing a configuration of a control device 7 according to a second embodiment.

A charge-discharge system 1 according to the second embodiment has the same configuration as the charge-discharge system 1 according to the first embodiment except that the control device 7 stores a program 73 for deterioration estimation, a deterioration degree DB 74, a use history DB 75, and a learning model DB 76 in a storage unit 72.

The learning model DB 76 stores a first learning model and a second learning model to be described later.

The deterioration degree DB 74 has the same configuration as the deterioration degree DB 34.

Figure 9:
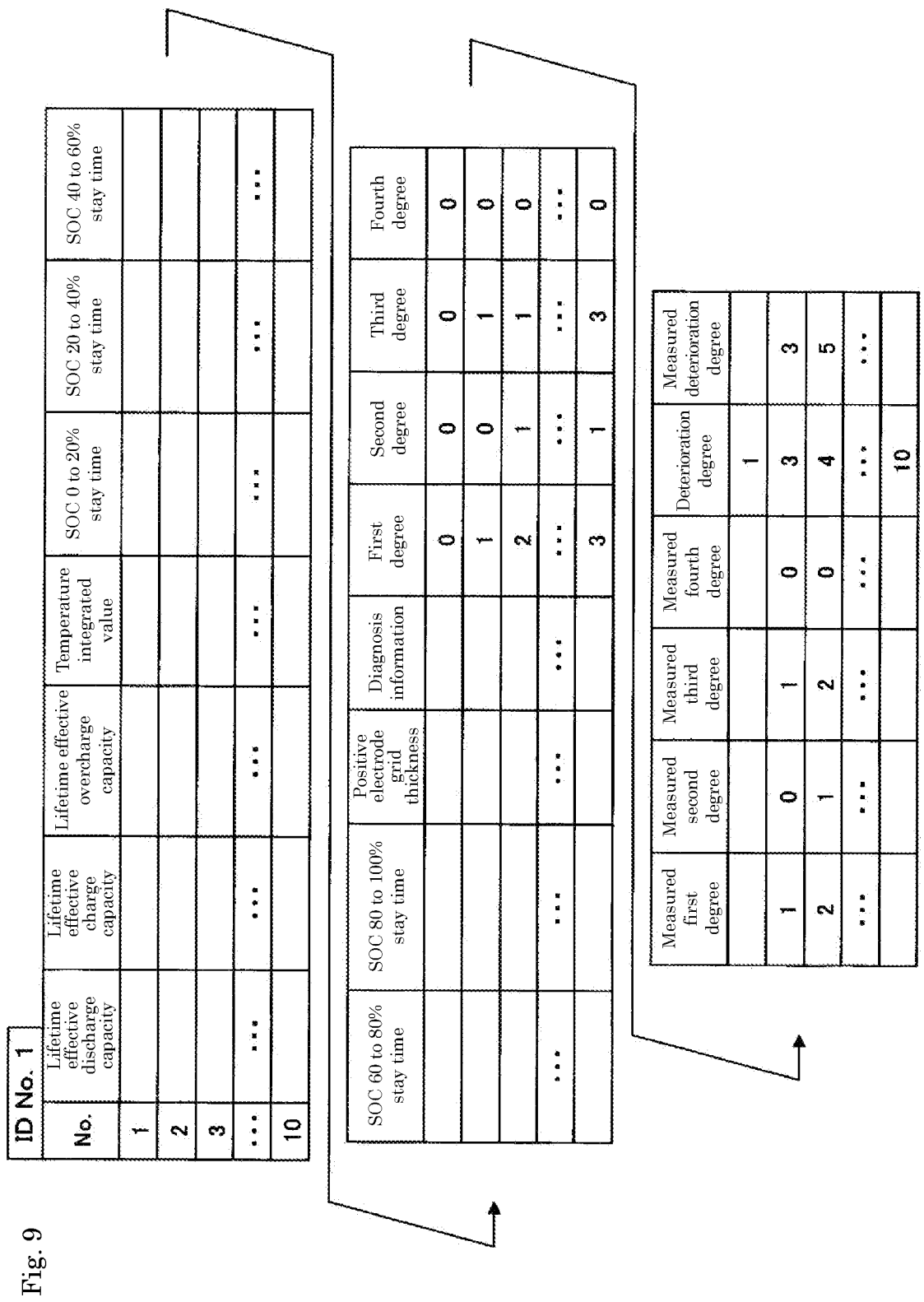
FIG. 9 is an explanatory diagram showing an example of a record layout of a use history DB.

FIG. 9 is an explanatory diagram showing an example of a record layout of the use history DB 75.

The use history DB 75 stores, for each battery 2, a derivation history at each estimation time point, diagnosis information, design information, a degree of a deterioration factor, a degree of a deterioration factor in actual measurement, a deterioration degree, and a deterioration degree based on actual measurement. FIG. 9 shows a use history of the battery 2 of ID No. 1. The use history DB 75 stores a No. column, a lifetime effective discharge capacity column, a lifetime effective charge capacity column, a lifetime effective overcharge capacity column, a temperature integrated value column, an SOC 0 to 20% stay time column, an SOC 20 to 40% stay time column, an SOC 40 to 60% stay time column, an SOC 60 to 80% stay time column, an SOC 80 to 100% stay time column, a positive electrode grid thickness column, a diagnosis information column, a first degree column, a second degree column, a third degree column, a fourth degree column, a measured first degree column, a measured second degree column, a measured third degree column, a measured fourth degree column, a deterioration degree column, and a measured deterioration degree column. The No. column stores the No. at an estimation time point. The lifetime effective discharge capacity column, the lifetime effective charge capacity column, the lifetime effective overcharge capacity column, the temperature integrated value column, the SOC 0 to 20% stay time column, the SOC 20 to 40% stay time column, the SOC 40 to 60% stay time column, the SOC 60 to 80% stay time column, the SOC 80 to 100% stay time column, the positive electrode grid thickness column, and the diagnosis information column store the same contents as the lifetime effective discharge capacity column, the lifetime effective charge capacity column, the lifetime effective overcharge capacity column, the temperature integrated value column, the SOC 0 to 20% stay time column, the SOC 20 to 40% stay time column, the SOC 40 to 60% stay time column, the SOC 60 to 80% stay time column, the SOC 80 to 100% stay time column, and the positive electrode grid thickness column in the deterioration degree DB 34.

As will be described later, the first degree column, the second degree column, the third degree column, and the fourth degree column store the first degree, the second degree, the third degree, and the fourth degree specified by inputting the derivation history at each estimation time point into the first learning model.

The deterioration degree column stores the deterioration degree estimated by inputting the specified first degree, second degree, third degree, and fourth degree into the second learning model.

The measured first degree column, the measured second degree column, the measured third degree column, and the measured fourth degree column respectively store the first degree, the second degree, the third degree, and the fourth degree obtained by actual measurement.

The measured deterioration degree column obtains SOH by actual measurement, and stores the determined deterioration degree.

The degree of the deterioration factor by actual measurement and the deterioration degree by actual measurement are obtained for use in relearning to be described later, and do not need to be obtained at all estimation time points.

Figure 10:
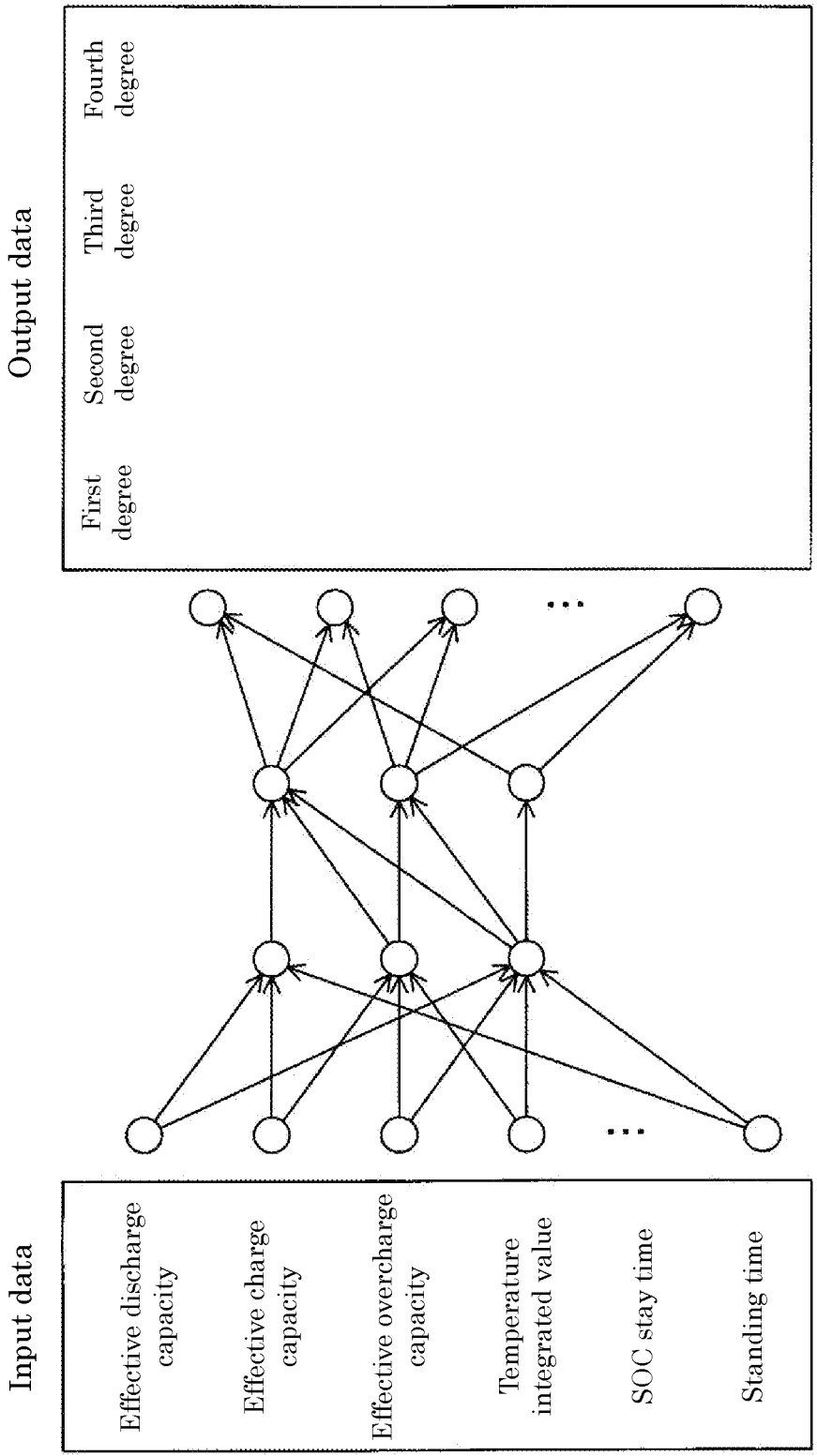
FIG. 10 is a schematic diagram showing an example of a first learning model.

FIG. 10 is a schematic diagram showing an example of the first learning model.

The first learning model is a learning model assumed to be used as a program module that is a part of artificial intelligence software, and a multilayer neural network (deep learning) can be used. For example, a convolutional neural network (CNN) can be used, but a recurrent neural network (RNN) may be used. Other machine learning may be used, such as decision trees, random forests, support vector machines, etc. The control unit 71 operates to perform calculation on the derivation history information input to the input layer of the first learning model according to the command from the first learning model, and output a combination of the first degree, the second degree, the third degree, and the fourth degree and the probability thereof. Although two intermediate layers are shown in FIG. 10 for convenience, the number of intermediate layers is not limited to two, and may be three or more. For a CNN, a convolution layer and a pooling layer are included. The number of nodes (neurons) is also not limited to the case of FIG. 10.

One or a plurality of nodes exist in the input layer, the output layer, and the intermediate layer, and the nodes of each layer are coupled to the nodes existing in the preceding and subsequent layers in one direction with a desired weight. A vector having the same number of components as the number of nodes in the input layer is provided as input data of the first learning model (input data for learning and input data for specifying the degree of the deterioration factor). The input data includes, as the derivation history information, an effective discharge capacity in a lifetime, an effective charge capacity in a lifetime, an effective overcharge capacity in a lifetime, a temperature integrated value, a SOC stay time, a standing time, and the like. The input information is not limited to this case. The above-described design information or diagnosis information may be input.

When the data given to each node of the input layer is input and given to the first intermediate layer, the output of the intermediate layer is calculated using the weight and the activation function, the calculated value is given to the next intermediate layer, and the calculated value is successively transmitted to the subsequent layer (lower layer) similarly until the output of the output layer is obtained. Note that all of the weights combining the nodes are calculated by a learning algorithm.

The output layer of the first learning model generates information in which the first degree, the second degree, the third degree, and the fourth degree are combined as output data. The number of nodes in the output layer corresponds to the number of combinations of the first degree, the second degree, the third degree, and the fourth degree. For example, when the first degree, the second degree, the third degree, and the fourth degree are represented by numerical values of 0 to 5, respectively, there are 1296 combinations of the degrees, but the number of nodes may be set only by a practical combination. The output layer outputs each combination and the probability of each combination.

The output layer outputs,
for example, first degree 1, second degree 3, third degree 3, and fourth degree 0 . . . 0.91
first degree 1, second degree 2, third degree 2, fourth degree 1 . . . 0.08
. . .
in this manner.

In addition, the output layer may have four nodes that output evaluation values and probabilities of the first degree, the second degree, the third degree, and the fourth degree. For example, numerical values of 0 to 5 and probabilities for each are output from the node of the first degree. The control unit 71 acquires the degree and probability of a predetermined number of combinations of probability values from the top. For each degree, an evaluation value having the maximum probability may be acquired.

Note that, although the learning model 156 has been described as a CNN, an RNN can be used as described above. In the RNN, the intermediate layer at the previous time is used for learning together with the input layer at the next time.

Figure 11:
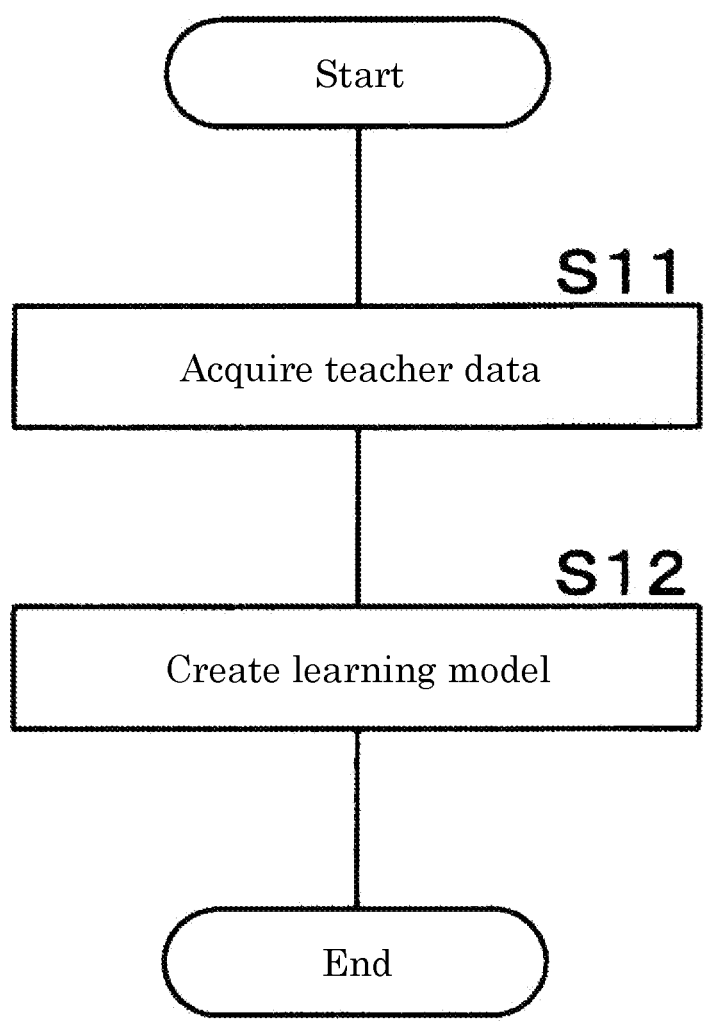
FIG. 11 is a flowchart showing a procedure of processing of generating the first learning model by a control unit.

FIG. 11 is a flowchart showing a procedure of processing of generating the first learning model by the control unit 71.

The control unit 71 reads the deterioration degree DB 74, and acquires teacher data in which the history of each column is associated with the first degree, the second degree, the third degree, and the fourth degree (S11).

The control unit 71 uses the teacher data to generate the first learning model (learned model) that outputs a combination of the first degree, the second degree, the third degree, and the fourth degree when the derivation history is input (S12). Specifically, the control unit 71 inputs teacher data to the input layer, performs calculation processing in the intermediate layer, and acquires a combination and a probability from the output layer.

The control unit 71 compares the specification result of each degree output from the output layer with information labeled with the history information in the teacher data, that is, the correct value, and optimizes the parameter used for the calculation processing in the intermediate layer so that the output value from the output layer approaches the correct value. The parameter is, for example, the above-described weight (coupling coefficient), the coefficient of the activation function, or the like. The parameter optimization method is not particularly limited, but for example, the control unit 71 optimizes various parameters using an error back propagation method.

The control unit 71 performs the above processing on the history information of each teacher data included in the deterioration degree DB 74 to generate the first learning model. The control unit 71 stores the generated first learning model in the storage unit 72, and ends the series of processing.

Figure 12:
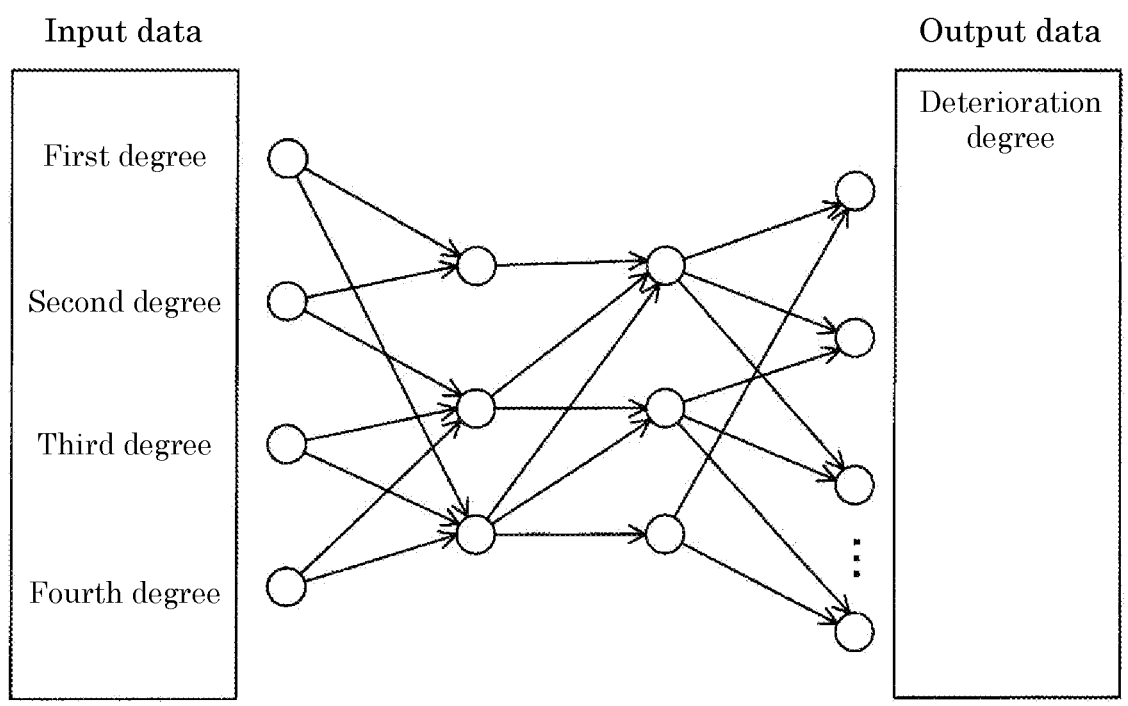
FIG. 12 is a schematic diagram showing an example of a second learning model.

FIG. 12 is a schematic diagram showing an example of the second learning model.

The second learning model is a learning model assumed to be used as a program module that is a part of the artificial intelligence software, and for example, CNN can be used, but RNN may be used. When the RNN is used, a temporal variation in the degree of the deterioration factor is input. Other machine learning may be used. The control unit 71 operates to perform calculation on the first degree, the second degree, the third degree, and the fourth degree input to the input layer of the second learning model according to a command from the learning model, and output the deterioration degree of the battery 2 and the probability thereof. Although two intermediate layers are shown in FIG. 12 for convenience, the number of intermediate layers is not limited to two, and may be three or more. The number of nodes is also not limited to the case of FIG. 12. In addition, data input by the first learning model may be included as input data.

The first degree, the second degree, the third degree, and the fourth degree are input to the input data. The input data includes at least two or more degrees.

The output layer of the second learning model generates a deterioration degree as output data. The number of nodes in the output layer corresponds to the number of deterioration degrees. For example, when the deterioration degree is represented by a numerical value of 1 to 10, the number of nodes can be set to 10. The output layer outputs each deterioration degree and a probability of each deterioration degree.

The output layer outputs,
for example, deterioration degree 1 . . . 0.01
deterioration degree 2 . . . 0.07
deterioration degree 3 . . . 0.88
. . .
in this manner.

The second learning model is generated similarly to the first learning model.

Figure 13:
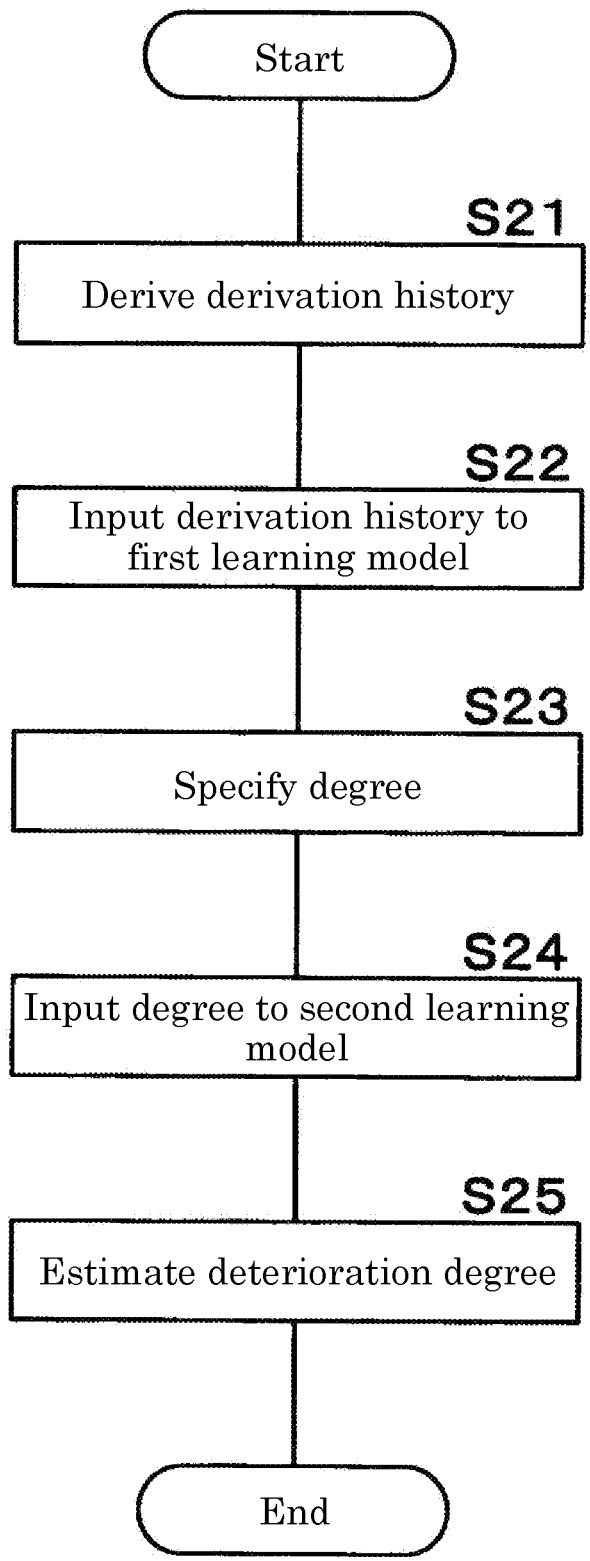
FIG. 13 is a flowchart showing a procedure of deterioration degree estimation processing by the control unit.

FIG. 13 is a flowchart showing a procedure of deterioration degree estimation processing by the control unit 71.

For the battery 2 of ID No. 1, the control unit 71 derives a derivation history such as the lifetime effective discharge capacity at the estimation time point, and stores the derivation histories in the use history DB 75 (S21). The design information and the diagnosis information may also be derived.

The control unit 71 reads the learning model DB 76 and inputs the derivation history to the first learning model (S22).

The control unit 71 specifies a combination having a high probability among the combinations of the first degree, the second degree, the third degree, and the fourth degree output from the first learning model (S23).

The control unit 71 inputs the specified combination of the first degree, the second degree, the third degree, and the fourth degree to the second learning model (S24).

The control unit 71 acquires the expected value [Σ (deterioration degree×probability)] based on the deterioration degree output from the second learning model, estimates the overall deterioration degree (S25), and ends the processing.

According to the present embodiment, the degree of the deterioration factor can be easily and satisfactorily specified using the first learning model, and the deterioration of the battery 2 can be easily and satisfactorily estimated using the second learning model based on the specified degree of the deterioration factor. In the above embodiment, the case where the first degree, the second degree, the third degree, and the fourth degree are specified to estimate the deterioration degree of the battery 2 has been described, but the present invention is not limited thereto.

At least two of the first degree, the second degree, the third degree, and the fourth degree may be specified, and the deterioration degree may be estimated using these. As described above, when the output layer of the first learning model has four nodes that output the evaluation values and probabilities of the first degree, the second degree, the third degree, and the fourth degree, the degree to be specified is selected by specifying a threshold value for the probability. When the output layer of the first learning model outputs a combination of the first degree, the second degree, the third degree, and the fourth degree, any one of the evaluation values of 0 to 5 and "unknown" is made to correspond to each degree. When the degree of "unknown" is included in the combination having the highest probability, the degree is not specified.

Using the first learning model and the second learning model, the control unit 71 can relearn the first learning model and the second learning model so that the reliability of the estimation of the deterioration degree is improved based on the deterioration degree estimated by inputting the derivation history and the deterioration degree obtained by actual measurement. For example, in No. 2 of the use history DB 35 in FIG. 9, since the degree of the deterioration factor estimated by the first learning model matches the degree of actual measurement, it is possible to increase the probability of the degree by inputting a large number of pieces of teacher data in which the degree is associated with the derivation history of No. 2 and causing relearning. Similarly, in No. 2, since the deterioration degree estimated by the second learning model matches the measured deterioration degree, it is possible to increase the probability of the deterioration degree by inputting a large number of pieces of teacher data in which the deterioration degree is associated with the degree of the deterioration factor of No. 2 and causing relearning. In the case of No. 3, the third degree does not match the measured third degree, and the deterioration degree does not match the measured deterioration degree. The teacher data in which the measured first degree, the measured second degree, the measured third degree, and the measured fourth degree are associated with the derivation history is input and relearning is caused.

When determining that the battery 2 has been replaced based on the estimated deterioration degree or diagnosis information and a preset threshold, the control unit 71 may delete and reset the data in the use history DB 75. When determining that the battery 2 has been replaced, the control unit 71 may set the starting time point of integration of the history information stored in the use history DB 75 as the time point at which it is determined that the battery 2 has been replaced.

In addition, among the data, data of a column including a measured deterioration degree may be stored in the deterioration degree DB 74.

Third Embodiment

A charge-discharge system 1 according to a third embodiment has the same configuration as the charge-discharge system 1 according to the second embodiment except that a learning model DB 76 stores learning models A, B, C, and D that input a derivation history and output probabilities of evaluation of the first degree, the second degree, the third degree, and the fourth degree, respectively.

Figure 14:
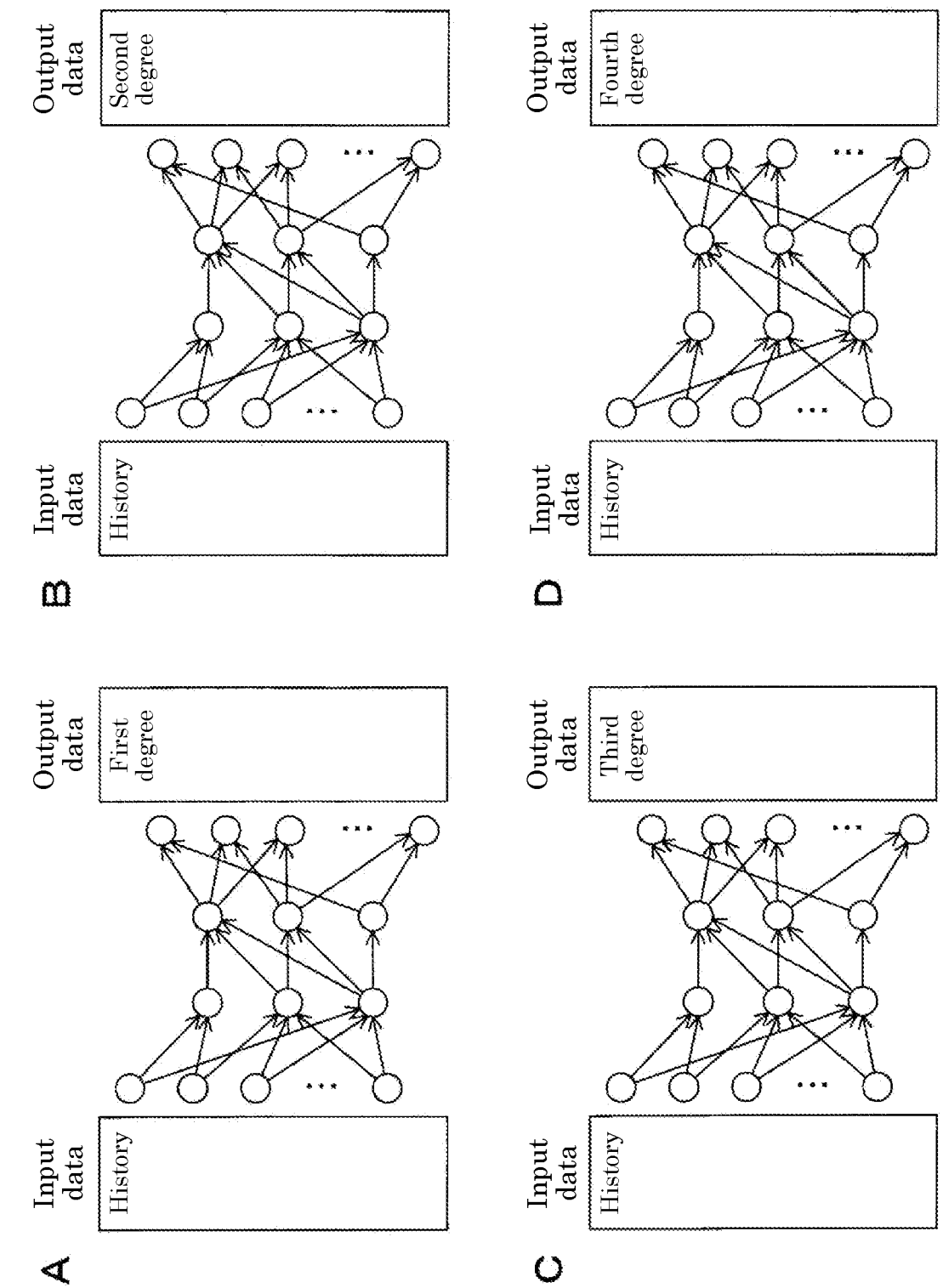
FIG. 14 is a schematic diagram showing examples of learning models A, B, C, and D.

FIG. 14 is a schematic diagram showing examples of the learning models A, B, C, and D.

The learning model A is a learning model assumed to be used as a program module that is a part of the artificial intelligence software, and for example, CNN can be used, but RNN may be used. Other machine learning may be used. The control unit 71 operates to perform calculation on the derivation history input to the input layer of the learning model A according to a command from the learning model A, and output the first degree of the battery 2 and the probability thereof. Although two intermediate layers are shown in FIG. 14 for convenience, the number of intermediate layers is not limited to two, and may be three or more. The number of nodes is also not limited to the case of FIG. 14.

Derivation histories of a lifetime effective discharge capacity, a temperature integrated value, a use period, and the like are input to the input layer of the learning model A.

The output layer of the learning model A outputs the first degree. The number of nodes in the output layer corresponds to the number of first degrees. For example, when the first degree is represented by a numerical value of 0 to 5, the number of nodes can be set to 6. The output layer outputs the evaluation value of the first degree and the probability of each evaluation value.

The output layer outputs, for example, first degree 0 . . . 0.01 first degree 1 . . . 0.87 first degree 2 . . . 0.08

. . .

in this manner.

The control unit 71 reads the deterioration degree DB 74, acquires teacher data in which the first degree is associated with the derivation history, and generates the learning model A using the teacher data.

Derivation histories of a lifetime effective overcharge capacity, a temperature integrated value, a use period, and the like are input to the input layer of the learning model B.

The output layer of the learning model B outputs the second degree. The number of nodes in the output layer corresponds to the number of second degrees. For example, when the second degree is represented by a numerical value of 0 to 5, the number of nodes can be set to 6. The output layer outputs the evaluation value of the second degree and the probability of each evaluation value.

The control unit 71 reads the deterioration degree DB 74, acquires teacher data in which the second degree is associated with the derivation history, and generates the learning model B using the teacher data.

Derivation histories of a lifetime effective charge capacity, a temperature integrated value, a use period, a standing time, a stay time in each SOC section, and the like are input to the input layer of the learning model C.

The output layer of the learning model C outputs the third degree. The number of nodes in the output layer corresponds to the number of third degrees. For example, when the third degree is represented by a numerical value of 0 to 5, the number of nodes can be set to 6. The output layer outputs the evaluation value of the third degree and the probability of each evaluation value.

The control unit 71 reads the deterioration degree DB 74, acquires teacher data in which the third degree is associated with the derivation history, and generates the learning model C using the teacher data.

Derivation histories of a lifetime effective charge capacity, a temperature integrated value, a use period, and the like are input to the input layer of the learning model D.

The output layer of the learning model D outputs the fourth degree. The number of nodes in the output layer corresponds to the number of fourth degrees. For example, when the fourth degree is represented by a numerical value of 0 to 5, the number of nodes can be set to 6. The output layer outputs the evaluation value of the fourth degree and the probability of each evaluation value.

The control unit 71 reads the deterioration degree DB 74, acquires teacher data in which the fourth degree is associated with the derivation history, and generates the learning model D using the teacher data.

Hereinafter, a method for estimating the deterioration degree will be described.

Figure 15:
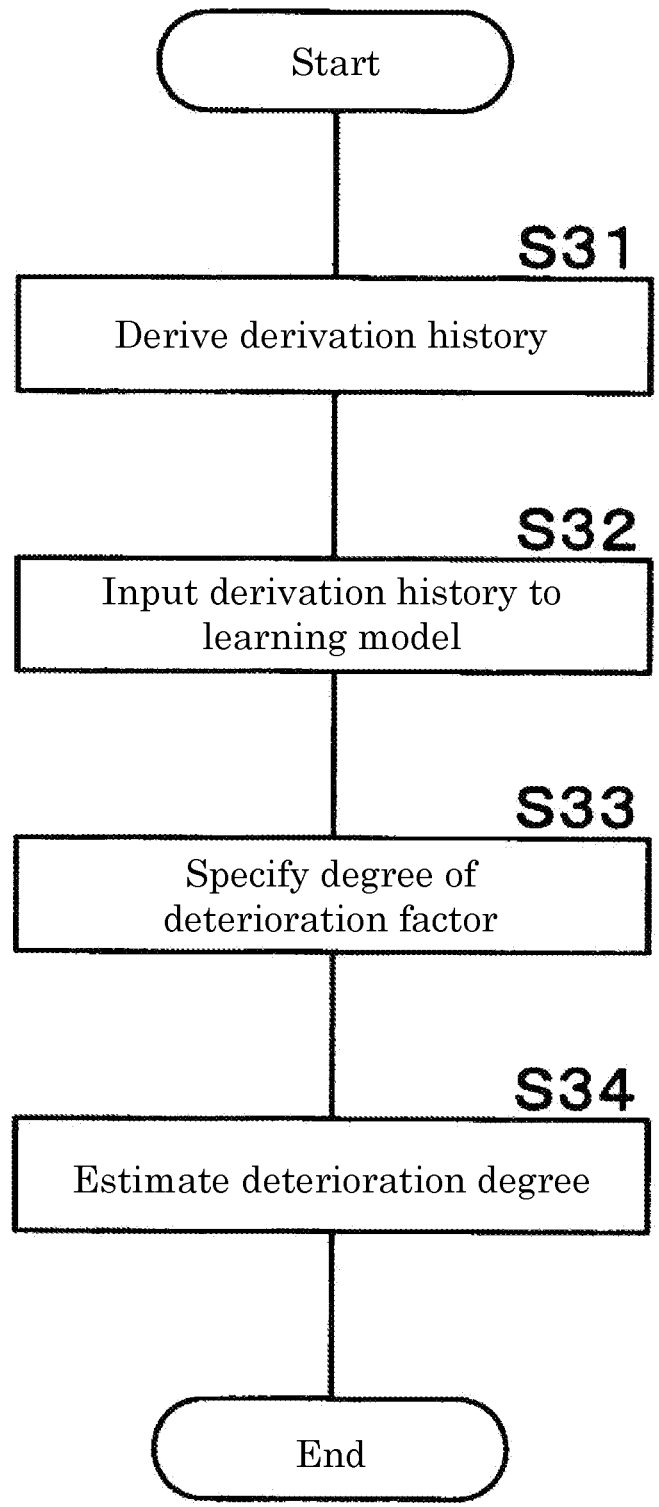
FIG. 15 is a flowchart showing a procedure of deterioration degree estimation processing by the control unit.

FIG. 15 is a flowchart showing a procedure of deterioration degree estimation processing by the control unit 71. The control unit 71 performs the following processing at a predetermined estimation time point.

For the battery 2 of ID No. 1, the control unit 71 derives derivation histories of the lifetime effective discharge capacity, the temperature integrated value, and the like based on the voltage, the current, and the temperature acquired at the time of estimation, and stores the derivation histories in the use history DB 75 (S31).

The control unit 71 reads the learning model DB 76 and inputs the derivation histories to the learning model A (S32).

The control unit 71 specifies the first degree having the highest probability among the first degrees output from the learning model A, and stores the first degree in the use history DB 75 (S33).

The control unit 71 estimates the deterioration degree based on the specified first degree (S34), stores the estimated deterioration degree in the use history DB 75, and ends the processing. The control unit 71 can estimate the deterioration degree based on the relationship between the first degree and the deterioration degree derived from the deterioration degree DB 74. A learning model may be generated using teacher data in which the deterioration degree is associated with the first degree, and the specified first degree may be input to the learning model to acquire the deterioration degree.

As for the second degree, the third degree, and the fourth degree, similarly to the above, the derivation histories can be input to the learning models B, C, and D, respectively, and specified, and the deterioration degree can be estimated based on the specified degree of the deterioration factor. As in the first and second embodiments, the deterioration degree may be estimated using the first degree, the second degree, the third degree, and the fourth degree.

According to the present embodiment, the degree of the deterioration factor can be easily and satisfactorily specified using the learning models A to D, and the deterioration of the battery 2 can be satisfactorily estimated based on the specified degree of the deterioration factor. The learning models A to D are not limited to the above-described cases. In addition, design information or diagnosis information may be input to the learning models A to D in addition to the derivation histories.

The present invention is not limited to the contents of the above-described embodiments, and various modifications can be made within the scope indicated in the claims That is, embodiments obtained by combining technical means appropriately changed within the scope indicated in the claims are also included in the technical scope of the present invention.

DESCRIPTION OF REFERENCE SIGNS

1: charge-discharge system
2: battery (energy storage device)
3: BMU
31, 71, 91: control unit (deriving unit, specifying unit, estimating unit, history erasing unit)
32, 72: storage unit
33, 73: program
34, 74: deterioration degree DB
35, 75: use history DB
36: input unit
37, 77, 92: communication unit
7: control device
76: learning model DB
9: server
10: network
13: load

The invention claimed is:

1. An estimation device comprising:
a deriving unit that derives a derivation history based on a current and a voltage of a first lead-acid battery and a temperature of the first lead-acid battery acquired at an estimation time point;
a specifying unit that specifies at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of:
a first relationship, which is obtained in advance, between a first history based on a current, a voltage, and a temperature of a second lead-acid battery which is different from the first lead-acid battery, and the first degree;
a second relationship, which is obtained in advance, between a second history based on a current, a voltage, and a temperature of a third lead-acid battery which is different from the first lead-acid battery and the same as or different from the second lead-acid battery, and the second degree;
a third relationship, which is obtained in advance, between a third history based on a current, a voltage, and a temperature of a fourth lead-acid battery which is different from the first lead-acid battery and the same as or different from the second and third lead-acid batteries, and the third degree; and
a fourth relationship, which is obtained in advance, between a fourth history based on a current, a voltage, and a temperature of a fifth lead-acid battery which is different from the first lead-acid battery and the same as or different from the second, third and fourth lead-acid batteries, and the fourth degree; and
an estimating unit that estimates a degree of deterioration of the first lead-acid battery based on the specified at least two degrees.

2. The estimation device according to claim 1, wherein, when the derivation history based on the current and the voltage of the first lead-acid battery and the temperature of the first lead-acid battery is input, the specifying unit specifies at least two degrees of the first degree, the second degree, the third degree, and the fourth degree by inputting the derived derivation history to a first learning model that outputs the at least two degrees, and
wherein, when at least two degrees of the first degree, the second degree, the third degree, and the fourth degree are input, the estimating unit inputs the specified at least two degrees to a second learning model that outputs the degree of deterioration of the first lead-acid battery to estimate the degree of deterioration.

3. The estimation device according to claim 1, wherein the derivation history includes an effective discharge capacity obtained by correcting a discharge capacity with a coefficient based on a temperature, an effective charge capacity obtained by correcting a charge capacity with a coefficient based on a temperature, or a temperature integrated value obtained by multiplying a temperature by a predetermined coefficient and integrating the temperature.

4. The estimation device according to claim 1, wherein the specifying unit specifies the at least two degrees based on the derivation history and design information of at least either one of the second to fifth lead-acid batteries.

5. The estimation device according to claim 4, wherein the design information is at least one selected from the group consisting of a number of plates, an amount of a positive active material, a mass of a positive electrode grid, a thickness of the positive electrode grid, a design of the positive electrode grid, a density of a positive electrode material, a composition of the positive electrode material, an amount and a type of an additive in the positive electrode material, a composition of a positive electrode alloy, a presence or absence, a thickness, a material and an air permeability of nonwoven fabric abutting on a positive electrode plate, an amount of a negative active material, an amount and a type of carbon in the negative active material, an amount and a type of an additive in a negative electrode material, a specific surface area of the negative electrode material, a type and a concentration of an additive of an electrolyte solution, and a specific gravity and an amount of the electrolyte solution.

6. The estimation device according to claim 1, wherein the estimating unit estimates the degree of deterioration based on the at least two degrees and diagnosis information of at least either one of the second to fifth lead-acid batteries.

7. The estimation device according to claim 6, wherein the diagnosis information is at least one selected from the group consisting of an internal resistance, an open circuit voltage, and an SOC.

8. The estimation device according to claim 6, further comprising:
a storage unit that stores the derivation history and the degree of deterioration or the diagnosis information specified by the specifying unit; and
a history erasing unit that erases the derivation history and the degree of deterioration or the diagnosis information when it is estimated that the first lead-acid battery has been replaced based on the degree of deterioration or the diagnosis information and a threshold.

9. An estimation device comprising:
a deriving unit that derives a derivation history based on a current and a voltage of a lead-acid battery and a temperature of the lead-acid battery;
a specifying unit that specifies, when the derivation history based on the current and the voltage of the lead-acid battery and the temperature of the lead-acid battery is input, at least two degrees of a first degree of softening of a positive electrode material, a second degree of corrosion of a positive electrode grid, a third degree of negative electrode sulfation, and a fourth degree of shrinkage of a negative electrode material by inputting the derived derivation history to a first learning model that outputs the at least two degrees; and
an estimating unit that estimates a degree of deterioration of the lead-acid battery based on the specified at least two degrees,
wherein, when at least two degrees of the first degree, the second degree, the third degree, and the fourth degree are input, the estimating unit inputs the specified at least two degrees to a second learning model that outputs the degree of deterioration of the lead-acid battery to estimate the degree of deterioration.

10. An estimation method comprising:
deriving a derivation history based on a current and a voltage of a first lead-acid battery and a temperature of the first lead-acid battery acquired at an estimation time point;
specifying at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of:
a first relationship, which is obtained in advance, between a first history based on a current, a voltage, and a temperature of a second lead-acid battery which is different from the first lead-acid battery, and the first degree;
a second relationship, which is obtained in advance, between a second history based on a current, a voltage, and a temperature of a third lead-acid battery which is different from the first lead-acid battery and the same as or different from the second lead-acid battery, and the second degree;
a third relationship, which is obtained in advance, between a third history based on a current, a voltage, and a temperature of a fourth lead-acid battery which is different from the first lead-acid battery and the same as or different from the second and third lead-acid batteries, and the third degree; and
a fourth relationship, which is obtained in advance, between a fourth history based on a current, a voltage, and a temperature of a fifth lead-acid battery which is different from the first lead-acid battery and the same as or different from the second, third and fourth lead-acid batteries, and the fourth degree; and
estimating a degree of deterioration of the lead-acid battery based on the specified at least two degrees.

11. A non-transitory computer-readable recording medium storing a computer program that causes a computer to execute processing of:
deriving a derivation history based on a current and a voltage of a first lead-acid battery and a temperature of the first lead-acid battery acquired at an estimation time point;
specifying at least two degrees of a first degree of softening of a positive electrode material, a second degree of corrosion of a positive electrode grid, a third degree of negative electrode sulfation, and a fourth degree of shrinkage of a negative electrode material based on the derived derivation history and at least two relationships selected from the group consisting of:
a first relationship, which is obtained in advance, between a first history based on a current, a voltage, and a temperature of a second lead-acid battery which is different from the first lead-acid battery, and the first degree;
a second relationship, which is obtained in advance, between a second history based on a current, a voltage, and a temperature of a third lead-acid battery which is different from the first lead-acid battery and the same as or different from the second lead-acid battery, and the second degree;
a third relationship, which is obtained in advance, between a third history based on a current, a voltage, and a temperature of a fourth lead-acid battery which is different from the first lead-acid battery and the same as or different from the second and third lead-acid batteries, and the third degree; and
a fourth relationship, which is obtained in advance, between a fourth history based on a current, a voltage, and a temperature of a fifth lead-acid battery which is different from the first lead-acid battery and the same as or different from the second, third and fourth lead-acid batteries, and the fourth degree; and
estimating a degree of deterioration of the lead-acid battery based on the specified at least two degrees.

* * * * *